US012677507B2

(12) United States Patent
Hosokawa

(10) Patent No.: US 12,677,507 B2
(45) Date of Patent: Jul. 7, 2026

(54) LIGHT EMITTING ELEMENT AND METHOD OF MANUFACTURING LIGHT EMITTING ELEMENT

(71) Applicant: NICHIA CORPORATION, Anan (JP)

(72) Inventor: Yasunobu Hosokawa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 414 days.

(21) Appl. No.: 17/373,140

(22) Filed: Jul. 12, 2021

(65) Prior Publication Data

US 2022/0029057 A1     Jan. 27, 2022

(30) Foreign Application Priority Data

Jul. 21, 2020   (JP) ................................. 2020-124209
Feb. 12, 2021   (JP) ................................. 2021-021054

(51) Int. Cl.
| | |
|---|---|
| *H10H 20/819* | (2025.01) |
| *H10H 20/01* | (2025.01) |
| *H10H 20/82* | (2025.01) |
| *H10H 20/825* | (2025.01) |
| *H10H 20/832* | (2025.01) |

(52) U.S. Cl.
CPC ...... *H10H 20/82* (2025.01); *H10H 20/01335* (2025.01); *H10H 20/825* (2025.01); *H10H 20/835* (2025.01); *H10H 20/032* (2025.01)

(58) Field of Classification Search
CPC .............................. H10H 20/819; H01L 33/20
USPC ......................................................... 257/98
See application file for complete search history.

(56) References Cited

U.S. PATENT DOCUMENTS

| | | | |
|---|---|---|---|
| 2005/0199891 A1* | 9/2005 | Kunisato ................. | H01L 33/20 257/85 |
| 2009/0212697 A1* | 8/2009 | Nakamura ........ | C04B 35/62675 313/506 |
| 2011/0049537 A1 | 3/2011 | Lee et al. | |
| 2012/0007118 A1* | 1/2012 | Choi ....................... | H01L 33/60 257/E33.072 |
| 2012/0235168 A1 | 9/2012 | Katsuno et al. | |
| 2013/0087814 A1 | 4/2013 | Moon et al. | |

(Continued)

FOREIGN PATENT DOCUMENTS

| | | |
|---|---|---|
| CN | 103035803 A | 4/2013 |
| JP | 2011-054967 A | 3/2011 |

(Continued)

*Primary Examiner* — Hsin Yi Hsieh
(74) *Attorney, Agent, or Firm* — Foley & Lardner LLP

(57) ABSTRACT

A light emitting element includes a first conductivity type semiconductor layer that is a nitride semiconductor layer containing Al and Ga. The first conductivity type semiconductor layer includes a first layer and a second layer. An Al percentage composition of the first layer is lower than an Al percentage composition of the second layer. The first conductivity type semiconductor layer has a first region and a second region. The first region is a region where the second conductivity type semiconductor layer and the active layer are stacked. The second region is exposed from the second conductivity type semiconductor layer and the active layer, and is connected to a first conductive member. A thickness of the first layer in the first region is smaller than a thickness of the first layer in the second region, or the second layer is exposed from the first layer in the first region.

6 Claims, 19 Drawing Sheets

(56) References Cited

U.S. PATENT DOCUMENTS

| 2014/0027805 A1 | 1/2014 | Engl et al. |
| 2014/0110737 A1 | 4/2014 | Matsumura |
| 2014/0239341 A1 | 8/2014 | Matsumura |
| 2014/0306247 A1 | 10/2014 | Lee |
| 2015/0263223 A1 | 9/2015 | Ito et al. |
| 2016/0211417 A1 | 7/2016 | Katsuno et al. |
| 2016/0359087 A1 | 12/2016 | Lee et al. |
| 2018/0323341 A1 | 11/2018 | Koo et al. |
| 2019/0044027 A1 | 2/2019 | Lee et al. |
| 2019/0074403 A1 | 3/2019 | Inazu et al. |
| 2020/0259042 A1 * | 8/2020 | Park .................... H10H 20/825 |
| 2020/0287076 A1 | 9/2020 | Choi et al. |
| 2021/0399176 A1 * | 12/2021 | Sung ...................... H01L 33/12 |

FOREIGN PATENT DOCUMENTS

| JP | 2012-195321 A | 10/2012 | |
| JP | 2013-084878 A | 5/2013 | |
| JP | 2014-086572 A | 5/2014 | |
| JP | 2014-195055 A | 10/2014 | |
| JP | 2015-177135 A | 10/2015 | |
| JP | 2016-134423 A | 7/2016 | |
| JP | 2017-201655 A | 11/2017 | |
| KR | 10-2016-0089119 A | 7/2016 | |
| KR | 10-2018-0084652 A | 7/2018 | |
| KR | 20190060598 A | 6/2019 | |
| WO | WO-2017034356 A1 * | 3/2017 | ........... H10H 20/841 |
| WO | WO-2019/103556 A1 | 5/2019 | |

* cited by examiner

FIG. 2

LIGHT EMITTING ELEMENT AND METHOD OF MANUFACTURING LIGHT EMITTING ELEMENT

CROSS-REFERENCE TO RELATED APPLICATIONS

This application claims priority to Japanese Patent Application No. 2020-124209, filed on Jul. 21, 2020, and Japanese Patent Application No. 2021-021054, filed on Feb. 12, 2021, the disclosures of which are hereby incorporated by reference in their entireties.

BACKGROUND

The present disclosure relates to a light emitting element, and a method of manufacturing a light emitting element.

Japanese Patent Publication No. 2013-084878 discloses a technique to improve the light extraction efficiency of a light emitting element by partially reducing the thickness of the semiconductor layer disposed on the active layer on the light extraction face side in the semiconductor stack.

SUMMARY

One embodiment of the present disclosure aims to provide a light emitting element with improved light extraction efficiency, and a method of manufacturing the light emitting element.

According to one embodiment of the present disclosure, a light emitting element comprises: a semiconductor stack having a first conductivity type semiconductor layer, a second conductivity type semiconductor layer, and an active layer disposed between the first conductivity type semiconductor layer and the second conductivity type semiconductor layer; a first conductive member electrically connected to the first conductivity type semiconductor layer; and a second conductive member electrically connected to the second conductivity type semiconductor layer. The first conductivity type semiconductor layer is a nitride semiconductor layer containing Al and Ga. The first conductivity type semiconductor layer comprises a first layer and a second layer. An Al percentage composition of the first layer is lower than an Al percentage composition of the second layer. The first conductivity type semiconductor layer comprises: a first region where the second conductivity type semiconductor layer and the active layer are stacked; and a second region exposed from the second conductivity type semiconductor layer and the active layer. The second region is connected to the first conductive member. The thickness of the first layer in the first region is smaller than a thickness of the first layer in the second region, or there is no first layer in the first region.

According to one embodiment of the present disclosure, a method of manufacturing a light emitting element incudes: forming a semiconductor stack that comprises: a first conductivity type semiconductor layer, an active layer disposed on the first conductivity type semiconductor layer, and a second conductivity type semiconductor layer disposed on the active layer, wherein the first conductivity type semiconductor layer is a nitride semiconductor layer containing Al and Ga, the first conductive type semiconductor layer comprises a first layer disposed on the substrate and a second layer disposed on the first layer, and an Al percentage composition of the first layer is lower than an Al percentage composition of the second layer; removing a portion of the second conductivity type semiconductor layer and a portion of the active layer, thereby exposing a portion of the first conductivity type semiconductor layer from the second conductivity type semiconductor layer and the active layer to form a first region and a second region in the first conductivity type semiconductor layer, wherein the first region is a region where the second conductivity type semiconductor layer and the active layer remain unremoved, and the second region is a region where the portion of the first layer of the first conductivity type semiconductor layer is exposed from the second conductivity type semiconductor layer and the active layer; subsequent to forming the first region and the second region, exposing a surface of the first layer of the first conductivity type semiconductor layer by removing the substrate; and subsequent to exposing the surface of the first layer, removing at least a portion of the first layer in the first region, thereby maintaining the first layer with a greater thickness in the second region than the first layer in the first region, or exposing the second layer from the first layer in the first region.

According to certain embodiments of the present disclosure, it is possible to provide a light emitting element with improved light extraction efficiency, and a method of manufacturing the light emitting element.

BRIEF DESCRIPTION OF THE DRAWINGS

FIG. 2 is a schematic cross-sectional view taken along line II-II in FIG. 1.

DETAILED DESCRIPTION

Figure 1:
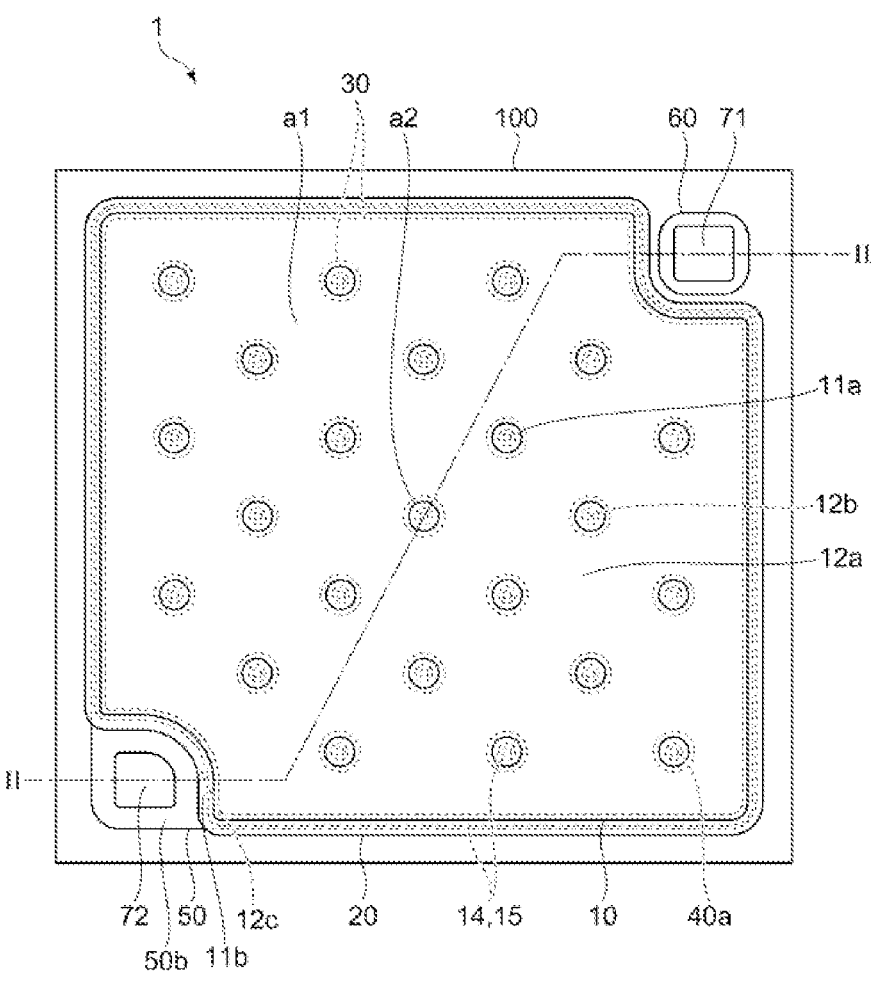
FIG. 1 is a schematic top view of some of the constituent elements of a light emitting element according to a first embodiment of the present disclosure.

Certain embodiments of the present disclosure will be explained below with reference to the accompanying drawings. In the drawings, the same reference numerals denote the same elements.

First Embodiment

Figure 2:
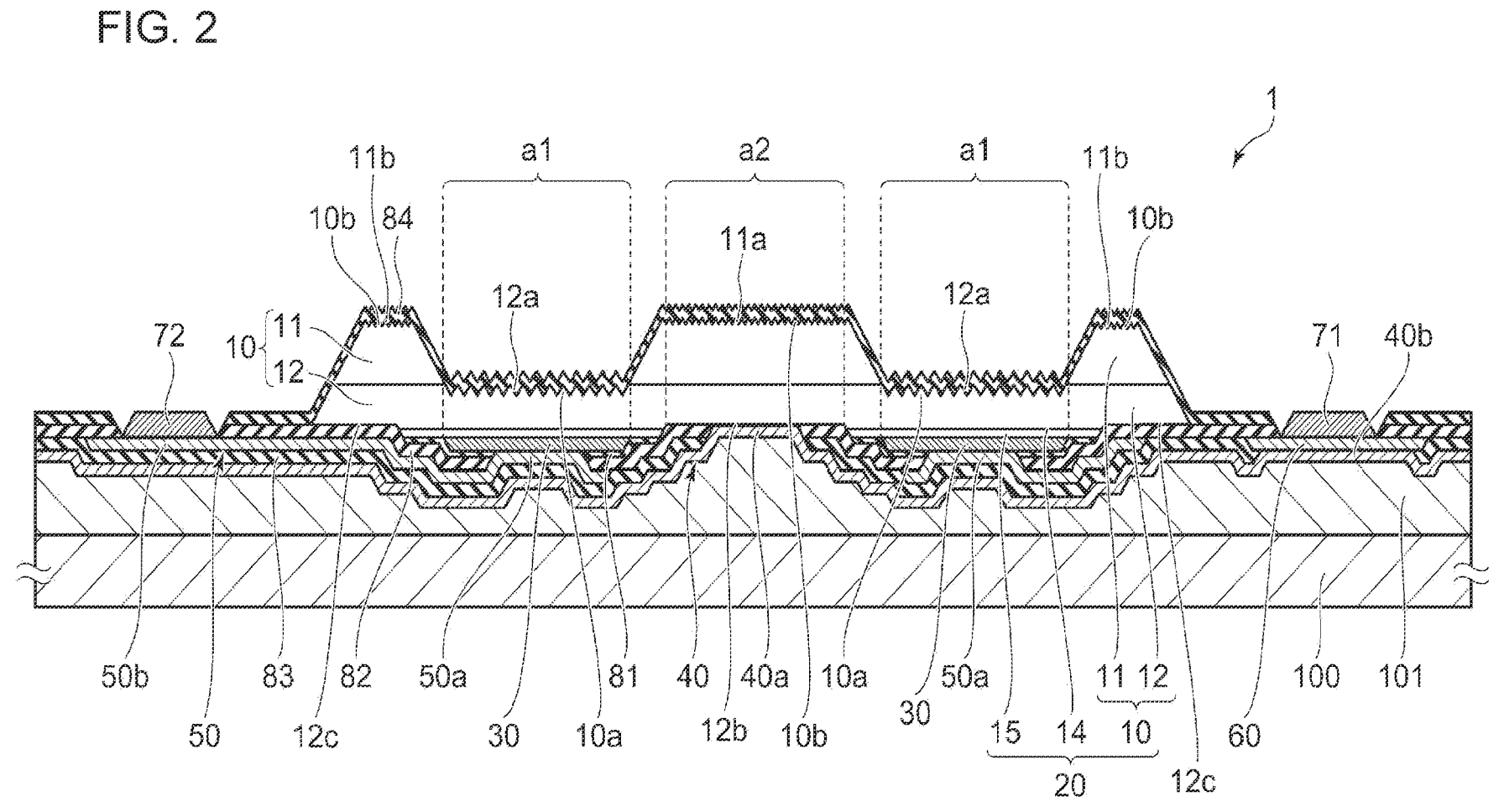

FIG. 1 is a schematic top view of some of the constituent elements of a light emitting element 1 according to a first embodiment of the present disclosure. FIG. 2 is a schematic cross-sectional view showing only the end faces along line II-II in FIG. 1.

The light emitting element 1 has a support substrate 100 and a semiconductor stack 20 disposed on the support substrate 100.

Figure 3:
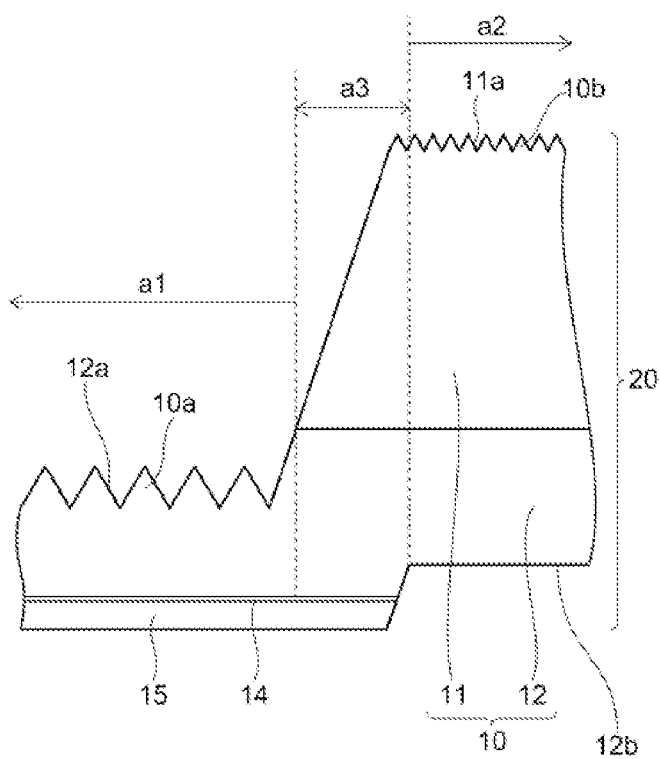
FIG. 3 is an enlarged schematic cross-sectional view of a portion of the semiconductor stack in the light emitting element according to the first embodiment of the present disclosure.

FIG. 3 is an enlarged schematic cross-sectional view of a portion of the semiconductor stack 20.

The semiconductor stack 20 has a first conductivity type semiconductor layer 10, a second conductivity type semiconductor layer 15, and an active layer 14. The active layer 14 is disposed between the first conductivity type semiconductor layer 10 and the second conductivity type semiconductor layer 15 and is an emission layer that emits light. For example, the peak wavelength of the light from the active layer 14 is no more than 400 nm, specifically 210 nm to 400 nm, more specifically 300 nm to 400 nm. For example, the active layer 14 emits ultraviolet light. Because the thickness of the active layer 14 is smaller than the thicknesses of the first conductivity type semiconductor layer 10 and the second conductivity type semiconductor layer 15, it is indicated by a line in FIG. 2. Similarly, the active layer 14 is shown as a line in FIGS. 4 to 13 and FIGS. 15 to 19.

The first conductivity type semiconductor layer 10, the second conductivity type semiconductor layer 15, and the active layer 14 are each formed of a nitride semiconductor layer. Nitride semiconductors include semiconductors of all compositions represented by the chemical formula, $In_xAl_yGa_{1-x-y}N$ ($0 \leq x < 1$, $0 \leq y < 1$, $x+y < 1$) with varied x and y percentages within the ranges. The first conductivity type semiconductor layer 10 is a nitride semiconductor layer containing Al and Ga, for example, an AlGaN layer. The first conductivity type semiconductor layer 10 is, for example, an n-type semiconductor layer. The first conductivity type semiconductor layer 10 contains as an n-type impurity Si, for example. The second conductivity type semiconductor layer 15 is, for example, a p-type semiconductor layer. The second conductivity type semiconductor layer 15 contains as a p-type impurity Mg, for example.

The first conductivity type semiconductor layer 10 has a first layer 11 and a second layer 12. The first layer 11 and the second layer 12 are, for example, AlGaN layers. The Al percentage composition of the first layer 11 is smaller than the Al percentage composition of the second layer 12. For example, the Al percentage composition of the first layer 11 is in a range of 1% to 3%. The Al percentage composition of the second layer 12 is in a range of 3% to 5%. The Al percentage composition difference between the first layer 11 and the second layer 12 is preferably in a range of 1% to 4%. For example, the Al percentage composition of the first layer 11 is 3%, and the Al percentage composition of the second layer 12 is 5%.

The first conductivity type semiconductor layer 10 has a first region a1 and a second region a2. The first region a1 and the second region a2 each have a second layer 12. The second layer 12, active layer 14 and the second conductivity type semiconductor layer 15 are stacked in the first region a1. The active layer 14 and the second conductivity type semiconductor layer 15 are successively stacked on the face of the second layer 12 on the support substrate 100 side in the first region a1.

There is no first layer 11 in the first region a1. The first layer 11 is not disposed on the first face 12*a* of the second layer 12 in the first region a1. The first face 12*a* of the second layer 12 is positioned, relative to the second layer 12, on the opposite side to the support substrate 100 in the first region a1, i.e., the first face 12*a* is exposed from the first layer 11. The first face 12*a* functions as a primary light extraction face. In a top view, the first region a1 is a region where the first face 12*a* is located. In a cross-sectional view, the first region a1 is the portion of the first conductivity type semiconductor layer 10 located immediately under the first face 12*a*.

The first layer 11 and the second layer 12 are stacked in the second regions a2, but neither an active layer 14 nor second conductivity type semiconductor layer 15 is stacked. The face (second face) 12*b* of the second layer 12 on the support substrate 100 side in the second regions a2 is exposed from the second conductivity type semiconductor layer 15 and the active layer 14. The second face 12*b* functions as a contact face with the first conductive member 40 described later. In the top view, a second region a2 is a region where a second face 12*b* is located. In a cross-sectional view, the second region a2 is a portion of the first conductivity type semiconductor layer 10 that is located immediately above the second face 12*b*.

As shown in FIG. 1, in a top view, a plurality of second regions a2 are arranged in island shapes, and the second regions a2 are surrounded by the first region a1. In a top view, the area of the first region a1 is larger than the sum of the areas of the second regions a2.

In the example shown in FIG. 3, there is a third region a3 between the first region a1 and the second region a2. In the third region a3, the first layer 11, the second layer 12, the active layer 14, and the second conductivity type semiconductor layer 15 are stacked. The third region a3, positioned between the first region a1 and the second region a2, includes at least a first layer 11 and a second layer 12. The first region a1 and the second region a2 can be made continuous by removing the active layer 14 and the second conductivity type semiconductor layer 15 in the third region a3.

The first layer 11 and the second layer 12 are stacked in the second regions a2. In the first region a1, a second layer 12 is disposed, but no first layer 11 is disposed. In the example shown in FIG. 2, the thickness of the first conductivity type semiconductor layer 10 in the first region a1 is smaller than the thickness of the first conductivity type semiconductor layer 10 in the second regions a2. The thickness of the first conductivity type semiconductor layer 10 in the first region a1 or the second regions a2 means the maximum thickness of the first conductivity type semiconductor layer 10 in the first region a1 or the second regions a2.

Figure 15:
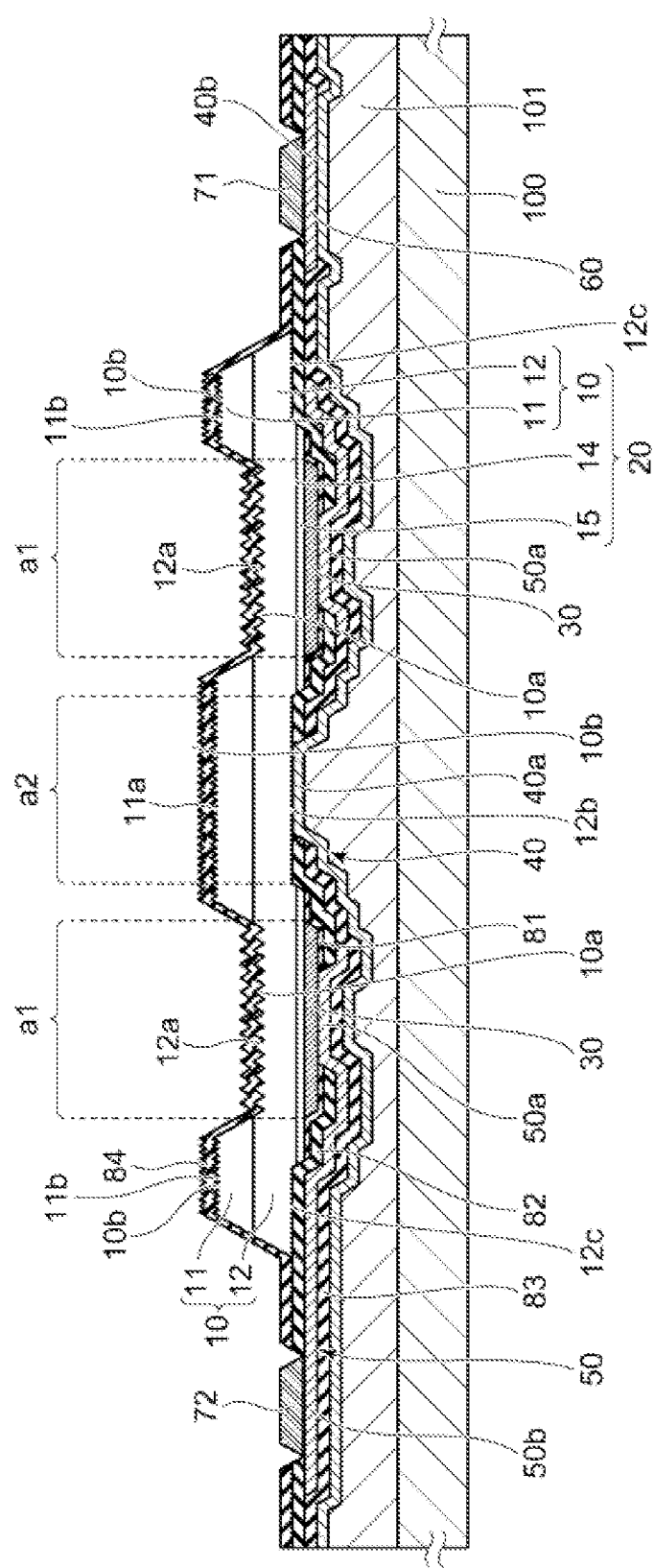
FIG. 15 is a schematic cross-sectional view of a variation of the light emitting element according to the first embodiment.

The thickness of the second layer 12 in the second regions a2 is preferably smaller than the thickness of the first layer 11 in the second regions a2. For example, the thickness of the second layer 12 in the second regions a2 is preferably no more than 80%, more preferably no more than 70% of the thickness of the first layer 11 in the second regions a2. The thickness of the first layer 11 in the second regions a2 is preferably, for example, 0.3 μm to 3 μm, more preferably 1 μm to 2.5 μm. For example, the thickness of the second layer 12 in the second regions a2 is preferably 0.3 μm to 1.5 μm, more preferably 0.5 μm to 1.2 μm. As shown in FIG. 15, the thickness of the first layer 11 can be set to be the same as the thickness of the second layer 12. In the present application, the thickness of the first layer 11 in the second regions a2 means the maximum thickness of the first layer 11 in the second regions a2. The thickness of the second layer 12 in the second regions a2 means the maximum thickness of the second layer 12 in the second regions a2.

The first layer 11 in the second regions a2 has a third face 11a opposite the face on which the second layer 12 is stacked. There is a height difference between the first face 12a of the second layer 12 in the first region a1 and the third face 11a of the first layer 11 in the second region a2. As shown in FIG. 1, in the top view, the outer edge of the third face 11a in the second region is positioned between the n-side conductive part 40a of the first conductive member 40 and the outer edge of the reflective electrode 30.

The first face 12a of the second layer 12 in the first region a1 is roughened whereby protrusions and depressions are formed on the first face 12a. The third face 11a of the first layer 11 in the second region a2 is roughened whereby protrusions and depressions are formed on the third face 11a. The sizes of the protrusions and depressions of the first face 12a and the third face 11a are smaller than the height difference between the first face 12a and the third face 11a.

The protrusions and depressions of the first face 12a include a plurality of first protrusions 10a. The protrusions and depressions of the third face 11a include a plurality of second protrusions 10b. The arithmetic mean height of the first protrusions 10a is greater than the arithmetic mean height of the second protrusions 10b. The first protrusions 10a and the second protrusions 10b are, for example, cone or pyramid shaped. The first protrusions 10a and the second protrusions 10b are triangular shaped in the cross section in FIG. 3, and the height of each of the first protrusions 10a and the second protrusions 10b is represented by the height of the triangular shape.

As shown in FIG. 2, the first layer 11 and the second layer 12 are stacked in the peripheral portion of the first conductivity type semiconductor layer 10. Neither an active layer 14 nor second conductivity type semiconductor layer 15 is stacked in the peripheral portion. The second layer 12 has a fourth face 12c exposed from the active layer 14 and the second conductivity type semiconductor layer 15. The fourth face 12c surrounds the area in which the first region a1 and the second regions a2 are formed in the top view in FIG. 1. The fifth face 11b is the surface of the first layer 11 in the peripheral portion of the first conductivity type semiconductor layer 10 and is also roughened, whereby a plurality of second protrusions 10b are formed on the fifth face 11b. The arithmetic mean height of the first protrusions 10a in the first region a1 is greater than the arithmetic mean height of the second protrusions 10b on the fifth face 11b in the peripheral portion of the first conductivity type semiconductor layer 10.

The light emitting element 1 further has a first conductive member 40, a second conductive member 50, a third conductive member 60, a reflective electrode 30, a first pad electrode 71, a second pad electrode 72, and first to fourth insulating films 81 to 84.

A reflective electrode 30 is disposed on the surface (opposite the face on which the active layer 14 is stacked) of the second conductivity type semiconductor layer 15. The reflective electrode 30 is in contact with the surface of the second conductivity type semiconductor layer 15. The reflective electrode 30 is electrically connected to the second conductivity type semiconductor layer 15. The reflective electrode 30 preferably has high reflectivity relative to the light emitted by the active layer 14. The reflective electrode 30 is, for example, a metal layer containing Ag. In the present application, the reflective electrode 30 having high reflectivity relative to the light emitted by the active layer 14 means having a reflectance of at least 70%, and preferably at least 80%, relative to the wavelength of the light from the active layer 14.

The surface of the second conductivity type semiconductor layer 15 also has a region in which the reflective electrode 30 is not disposed. The region is covered by a first insulating film 81. Furthermore, the first insulating film 81 also covers a portion of the reflective electrode 30. The first insulating film 81 is, for example, a silicon nitride film or silicon oxide film.

A second insulating film 82 covers the first insulating film 81. The second insulating film 82 also covers the fourth face 12c of the first conductivity type semiconductor layer 10, the lateral faces of the active layer 14, and the lateral faces of the second conductivity type semiconductor layer 15. The second insulating film 82 is, for example, a silicon oxide film.

A second conductive member 50 is disposed on the surface of the second insulating film 82. The second conductive member 50 is, for example, a metal layer containing at least either Al or Cu. The second conductive member 50 has a p-side conductive part 50a.

The reflective electrode 30 has a surface exposed from the first insulating film 81 and the second insulating film 82. The reflective electrode 30 is in contact with the p-side conductive part 50a of the second conductive member 50. The second conductive member 50 is electrically connected via the p-side conductive part 50a and the reflective electrode 30 to the second conductivity type semiconductor layer 15 stacked in the first region a1.

A third insulating film 83 covers the second conductive member 50. The third insulating film 83 is, for example, a silicon oxide film.

A first conductive member 40 is disposed on the surface of the third insulating film 83. The first conductive member 40 is, for example, a metal layer containing at least either Al or Cu. The first conductive member 40 has an n-side conductive part 40a.

A portion of the second face 12b of the second layer 12 in the second region a2 is covered by the second insulating film 82. The second face 12b is formed to have, for example, a circular shape in a top view, and the first insulating film 81 is formed outward from the outer edge of the second face 12b. The portion of the second face 12b, including its center, is exposed from the first insulating film 81 and in contact with the n-side conductive part 40a of the first conductive member 40. The first conductive member 40 is electrically connected to the first conductivity type semiconductor layer 10 via the n-side conductive part 40a.

The third insulating film 83 is disposed between the first conductive member 40 and the second conductive member 50, and the first conductive member 40 and the second conductive member 50 are insulated and separated from one another by the third insulating film 83.

As shown in FIG. 1, the support substrate 100 is square shaped in a top view. A first pad electrode 71 and a second pad electrode 72 are arranged at diagonal positions on the support substrate 100. The semiconductor stack 20 in a top view is formed to have a substantially square shape without the two diagonal corners where the first pad electrode 71 and the second pad electrode 72 are arranged.

As shown in FIG. 2, the first conductive member 40 has a pad connection part 40b positioned under the first pad electrode 71. A third conductive member 60 is disposed on the pad connection part 40b. The third conductive member 60 can be formed, for example, by using the same materials and the same process as those for forming the second conductive member 50. The third conductive member 60 is formed as an island shape separated from the second conductive member 50. The first pad electrode 71 is disposed on the third conductive member 60. The first pad electrode 71 is electrically connected to the first conductive member 40 via the third conductive member 60.

The second conductive member 50 has a pad connection part 50b positioned under the second pad electrode 72. The second pad electrode 72 is disposed on the pad connection part 50b and is electrically connected to the second conductive member 50.

The first pad electrode 71 and the second pad electrode 72, for example, contains at least one metal selected from the group consisting of Ti, Pt, and Au.

The first conductive member 40 is bonded to the support substrate 100 via the bonding layer 101. The bonding layer 101 is a metal layer that contains a soldering material such as Sn. The support substrate 100, for example, is a silicon substrate.

The upper face and the lateral faces of the semiconductor stack 20 are covered by a fourth insulating film 84. The upper face of the semiconductor stack 20 includes the first face 12a of the second layer 12 in the first region a1, the third face 11a of the first layer 11 in the second regions a2, and the fifth face 11b of the first layer 11 in the peripheral portion. The fourth insulating film 84 is, for example, a silicon oxide film.

The surface of the fourth insulating film 84 that covers the protrusions and depressions (including the first protrusions 10a) formed on the first face 12a in the first region a1, also has protrusions and depressions. The surface of the fourth insulating film 84 that covers the protrusions and depressions (including the second protrusions 10b) formed on the third face 11a in the second regions a2, also has protrusions and depressions. The surface of the fourth insulating film 84 that covers the protrusions and depressions (including the second protrusions 10b) formed on the fifth face 11b of the first layer 11 in the peripheral portion of the first conductivity type semiconductor layer 10, also has protrusions and depressions.

The arithmetic mean height of the protrusions formed on the surface of the fourth insulating film 84 in the first region a1 is greater than the arithmetic mean height of the protrusions formed on the surface of the fourth insulating film 84 in the second regions a2. The arithmetic mean height of the protrusions formed on the surface of the fourth insulating film 84 in the first region a1 is greater than the arithmetic mean height of the protrusions formed on the surface of the fourth insulating film 84 in the peripheral portion of the first conductivity type semiconductor layer 10. Forming protrusions having a greater arithmetic mean height on the surface of the fourth insulating film 84 in the first region a1 having an active layer 14 stacked thereon and having a large contribution to the light extraction efficiency may improve the light extraction efficiency.

The light emitted by the active layer 14 propagates through the first conductivity type semiconductor layer 10 to be extracted from the semiconductor stack 20. Because the second layer 12 has a higher Al percentage composition than Al percentage composition of the first layer 11 in the first conductivity type semiconductor layer 10, the light absorption rate in the second layer 12 is lower than the light absorption rate in the first layer 11. In the case in which the light emitted by the active layer 14 has a relatively short wavelength with a peak wavelength of no more than 400 nm, in particular, employing AlGaN having a high Al percentage composition for the first conductivity type semiconductor layer 10 can reduce the light absorption by the first conductivity type semiconductor layer 10 as compared to using GaN for the first conductivity type semiconductor layer 10. The light absorption in the first region a1 where the active layer 14 is stacked has a greater impact on the efficiency in extracting light from the semiconductor stack 20 than the light absorption in the second regions a2 where no active layer 14 is stacked. Accordingly, not disposing a first layer having higher light absorption than light absorption of the second layer 12 in the first region a1 can improve the light extraction efficiency as compared to the case in which a first layer 11 is disposed in the first region a1.

Because no first layer 11 is disposed in the first region a1, the thickness of the first conductivity type semiconductor layer 10 in the first region a1 is smaller than the thickness of the first conductivity type semiconductor layer 10 in the second regions a2. Reducing the thickness of the first conductivity type semiconductor layer 10 in the first region a1, which greatly affects the light extraction efficiency, can reduce the light absorption in the first region a1, thereby increasing the light extraction efficiency.

In the second regions a2, the first conductive member 40 is connected to the first conductivity type semiconductor layer 10, providing a current conducting part for the first conductivity type semiconductor layer 10. Forming not only a second layer 12, but also a first layer 11 that has a lower Al percentage composition than the second layer 12 in the second regions a2 can reduce the forward voltage (drive voltage) Vf as well as reducing the current concentration in the second regions a2 as compared to the case in which no first layer 11 is disposed in the second regions a2. Furthermore, making the thickness of the first conductivity type semiconductor layer 10 in the second regions a2 larger than the thickness of the first conductivity type semiconductor layer 10 in the first region a1 can reduce the resistance of the second regions a2 thereby lowering the Vf.

The higher the Al percentage composition in a nitride semiconductor layer containing Al and Ga, the higher the crack occurrence in the nitride semiconductor layer tends to be. The larger the thickness of a nitride semiconductor layer containing Al and Ga, the higher the crack occurrence in the nitride semiconductor layer tends to be. According to this embodiment, the thickness of the second layer 12 having a higher Al percentage composition is thinner than the first layer 11. This can reduce the crack occurrence in the first conductivity type semiconductor layer 10.

For the purpose of reducing the light absorption in the first region a1, lowering the Vf in the second regions a2, and reducing the crack occurrence in the first conductivity type semiconductor layer 10, the Al percentage composition in the first conductivity type semiconductor layer 10 is preferably in a range of 1% to 5%. Furthermore, the thickness of the second layer 12 in the second regions a2 is preferably smaller than the thickness of the first layer 11 in the second regions a2. For example, the thickness of the second layer 12 in the second regions a2 is preferably no more than 80% of the thickness of the first layer 11 in the second regions a2. Making the thickness of the second layer 12 in the second regions a2 smaller than the thickness of the first layer 11 in the second regions a2 can reduce the crack occurrence in the first conductivity type semiconductor layer 10 while lowering the Vf in the second regions a2.

Because a portion of the light extracted from the first region a1 may be absorbed by the first layer 11 disposed in the second regions a2, it is preferable to have a distance between the first region a1 and the second regions a2 to reduce the light absorption. On the other hand, providing too much distance between the first region a1 and the second regions a2 reduces the area of the second region a2 in a top view and may allow the current to concentrate in the second regions a2. According to this embodiment, the outer edge of the third face 11a is positioned between the outer edge of the n-side conductive part 40a of the first conductive member 40 and the outer edge of the reflective electrode 30 in the top view. This can reduce the light absorption by the first layer 11 in the second regions a2 while hindering the current from concentrating in the second regions a2.

The first conductive member 40 can be electrically connected to the fourth face 12c of the second layer 12 in the peripheral portion of the first conductivity type semiconductor layer 10. In this case, disposing not only a second layer 12, but also a first layer 11 having a smaller Al percentage composition than the second layer 12 in the peripheral portion of the first conductivity type semiconductor layer 10 can lower the Vf as compared to the case in which a first layer 11 is not disposed in the peripheral portion. This can also reduce the crack occurrence in the peripheral portion.

Next, a method of manufacturing a light emitting element 1 according to the first embodiment of the present disclosure will be explained with reference to FIG. 4 to FIG. 11.

Figure 4:
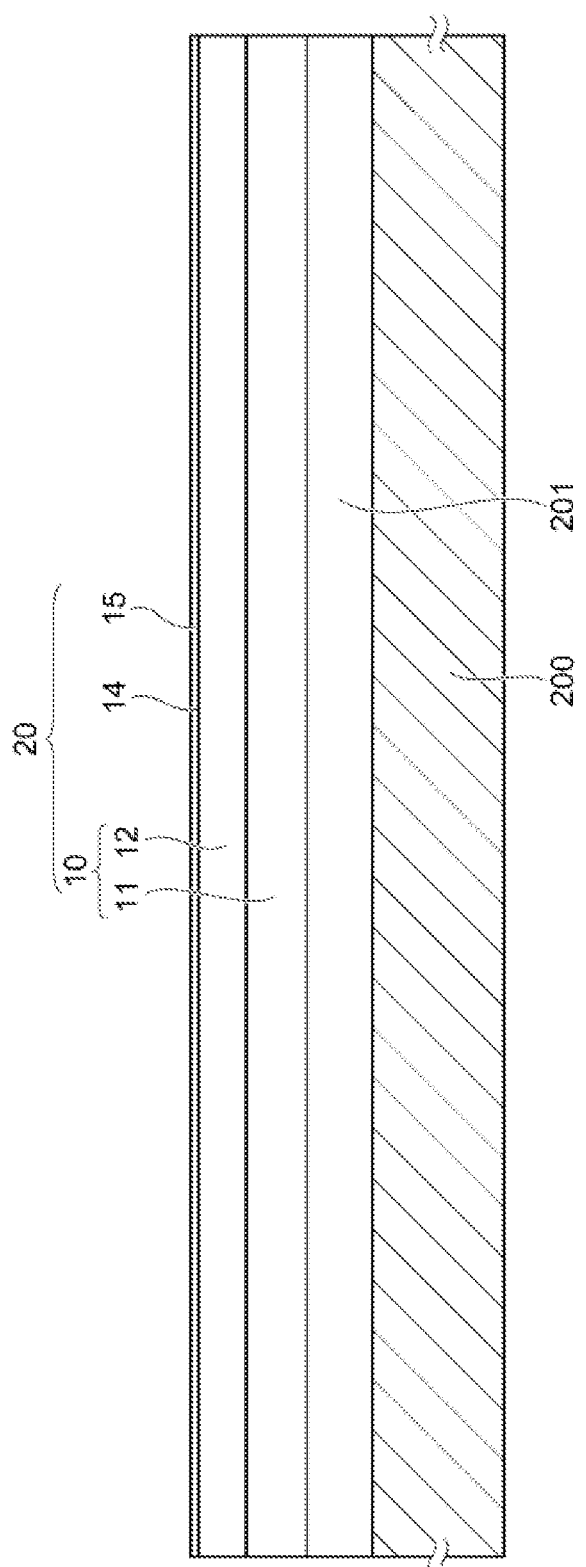
FIG. 4 is a schematic cross-sectional view showing a process in a method of manufacturing a light emitting element according to the first embodiment of the present disclosure.

As shown in FIG. 4, on a substrate 200, an underlayer 201 including, for example, an undoped GaN layer, is grown. The thickness of the underlayer 201 is, for example, 6 μm to 8 μm. Then a semiconductor stack 20 is formed via the underlayer 201. The substrate 200 is a substrate for allowing nitride semiconductor layers to grow, for example, a sapphire substrate. A buffer layer formed of, for example, AlGaN or AlN, can be formed on the substrate 200 before allowing the underlayer 201 to grow.

The semiconductor stack 20 includes a first conductivity type semiconductor layer 10, an active layer 14, and a second conductivity type semiconductor layer 15. The first conductivity type semiconductor layer 10 includes a first layer 11 and a second layer 12. On the underlayer 201, the first layer 11, the second layer 12, the active layer 14, and the second conductivity type semiconductor layer 15 are successively epitaxially grown. For example, MOCVD (metal organic chemical vapor deposition) technique can be used to form the semiconductor layers included in the semiconductor stack 20.

As described earlier, the first conductivity type semiconductor layer 10 is a nitride semiconductor layer containing Al and Ga in which the first layer 11 has a lower Al percentage composition than the Al percentage composition of the second layer 12. For example, the Al percentage composition of the first layer 11 is 3%, and the Al percentage composition of the second layer 12 is 5%.

In forming the semiconductor stack 20, it is preferable to form the first layer 11 to a thickness of, for example, 0.3 μm to 3 μm, more preferably 1 μm to 2.5 μm. For example, it is preferable to form the second layer 12 to a thickness of 0.3 μm to 1.5 μm, more preferably 0.5 μm to 1.2 μm. For example, the thickness of the first layer 11 is set to be 2 μm, and the thickness of the second layer 12 is set to be 1 μm. Forming the second layer 12, which has a higher Al percentage composition than the first layer 11, thinner than the first layer 11 can reduce the crack occurrence when the first conductivity type semiconductor layer 10 is grown.

Figure 5:
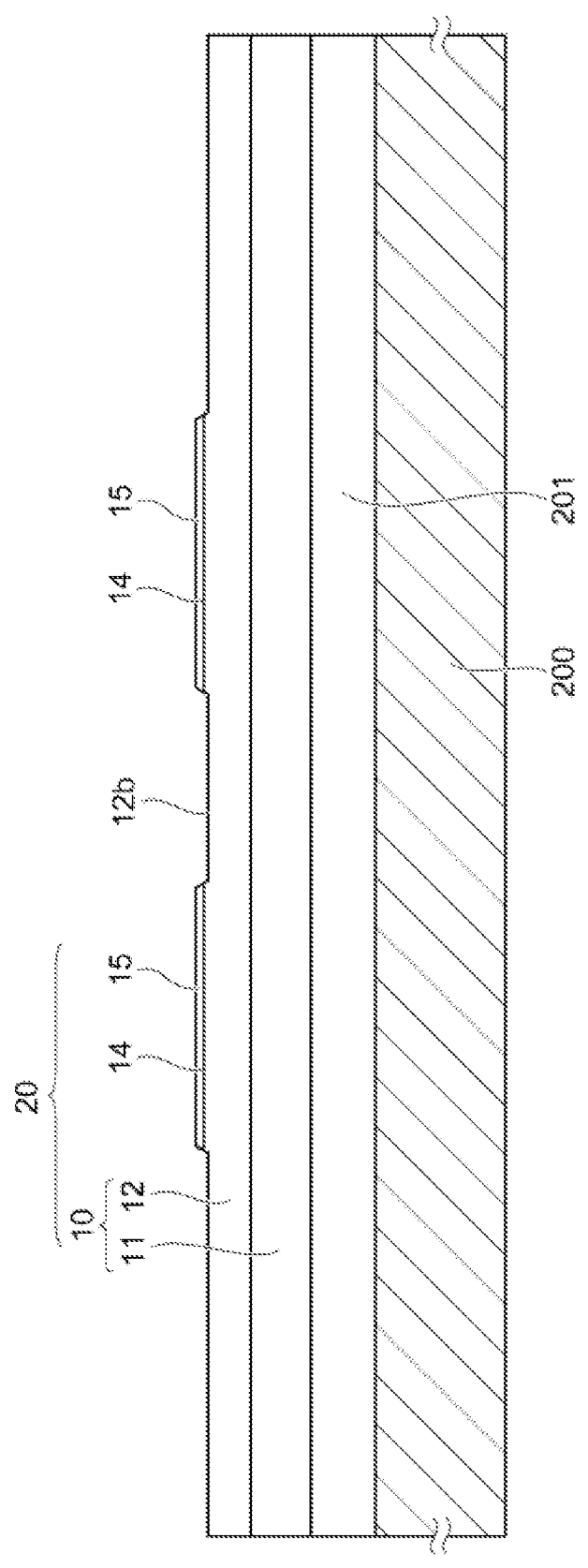
FIG. 5 is a schematic cross-sectional view showing a process in the method of manufacturing a light emitting element according to the first embodiment of the present disclosure.

After forming the semiconductor stack 20, as shown in FIG. 5, the second conductivity type semiconductor layer 15 and the active layer 14 are partially removed. For example, the second conductivity type semiconductor layer 15 and the active layer 14 are partially removed by RIE (reactive ion etching). The partial removal of the second conductivity type semiconductor layer 15 and the active layer 14 exposes portions of the second layer 12 of the first conductivity type semiconductor layer 10 from the second conductivity type semiconductor layer 15 and the active layer 14.

The first region a1 is where the second conductivity type semiconductor layer 15 and the active layer 14 remain unremoved. The second region a2 is located at the second layer 12 (the second face 12b that will serve as the conductive part for the first conductivity type semiconductor layer 10) exposed from the second conductivity type semiconductor layer 15 and the active layer 14.

Subsequently, in the state in which the semiconductor stack 20 is formed on the substrate 200, the reflective electrode 30, the first insulating film 81, the second insulating film 82, the second conductive member 50, the third conductive member 60, the third insulating film 83, and the first conductive member 40 described earlier with reference to FIG. 2 are formed. The reflective electrode 30, the first insulating film 81, the second insulating film 82, the second conductive member 50, the third conductive member 60, the third insulating film 83, and the first conductive member 40 can be formed by, for example, sputtering, vapor deposition, or the like. The second conductive member 50 and the third conductive member 60 can be formed by the same process. The p-side conductive part 50a of the second conductive member 50 is in contact with the reflective electrode 30, and the n-side conductive part 40a of the first conductive member 40 is in contact with the second face 12b of the first conductivity type semiconductor layer 10.

Figure 6:
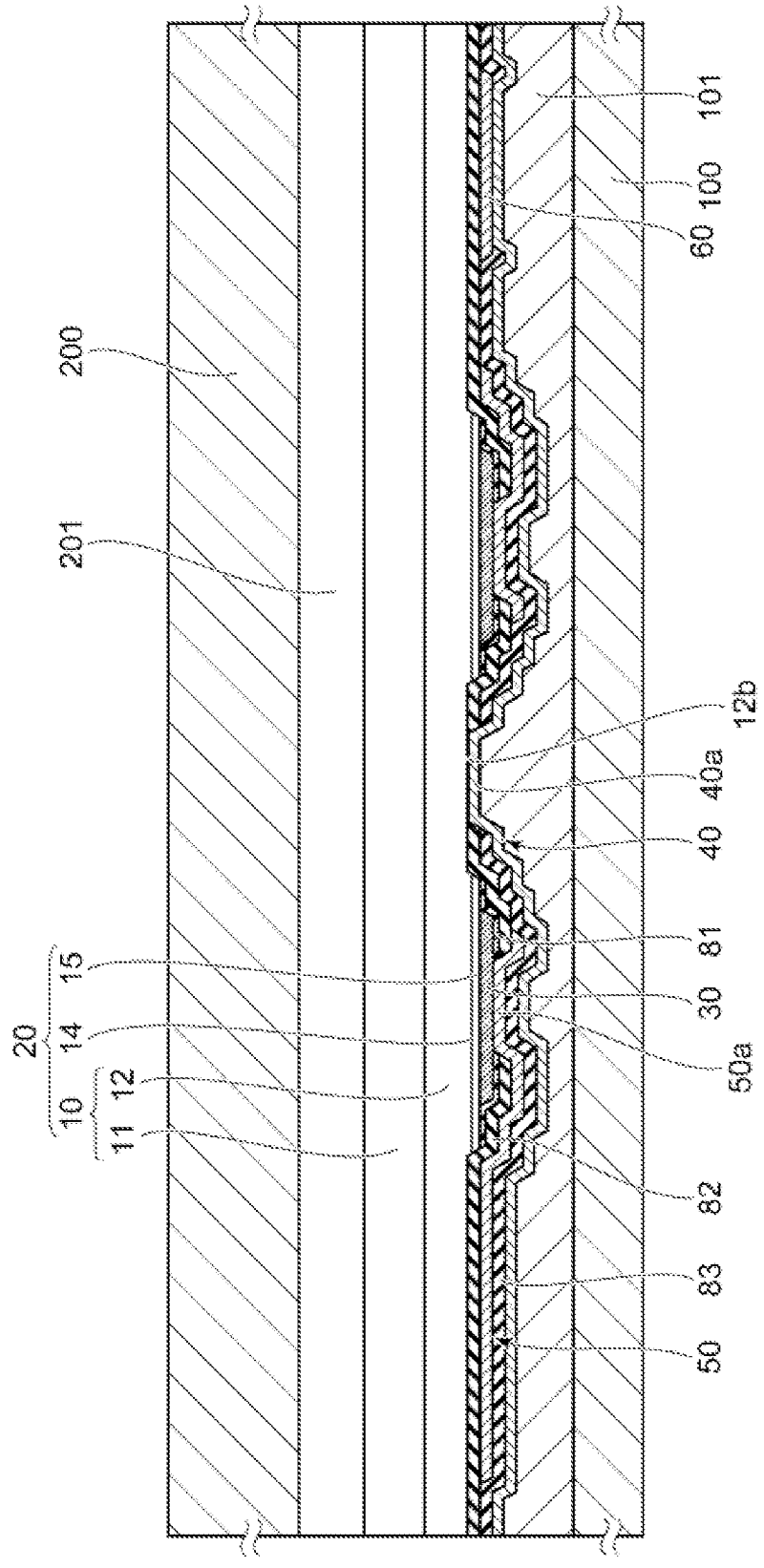
FIG. 6 is a schematic cross-sectional view showing a process in the method of manufacturing a light emitting element according to the first embodiment of the present disclosure.

Subsequently, as shown in FIG. 6, the first conductive member 40 is bonded to the support substrate 100 via a bonding layer 101. In FIG. 6, the structure in FIG. 5 is flipped upside down. The semiconductor stack 20 is bonded to the support substrate 100 while being held by the substrate 200.

Figure 7:
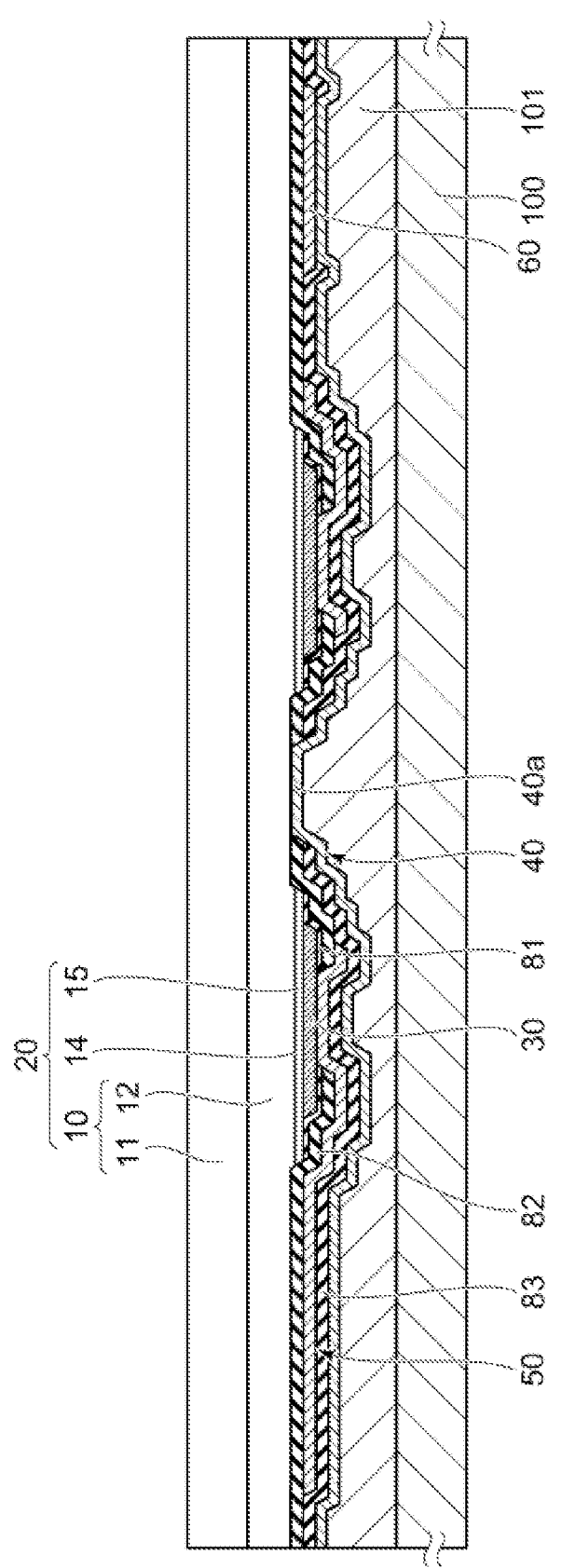
FIG. 7 is a schematic cross-sectional view showing a process in the method of manufacturing a light emitting element according to the first embodiment of the present disclosure.

After bonding the semiconductor stack 20 and the support substrate 100, the substrate 200 is removed, and the under-layer 201 is further removed. This exposes the surface of the first layer 11 of the first conductivity type semiconductor layer 10 as shown in FIG. 7.

Figure 8:
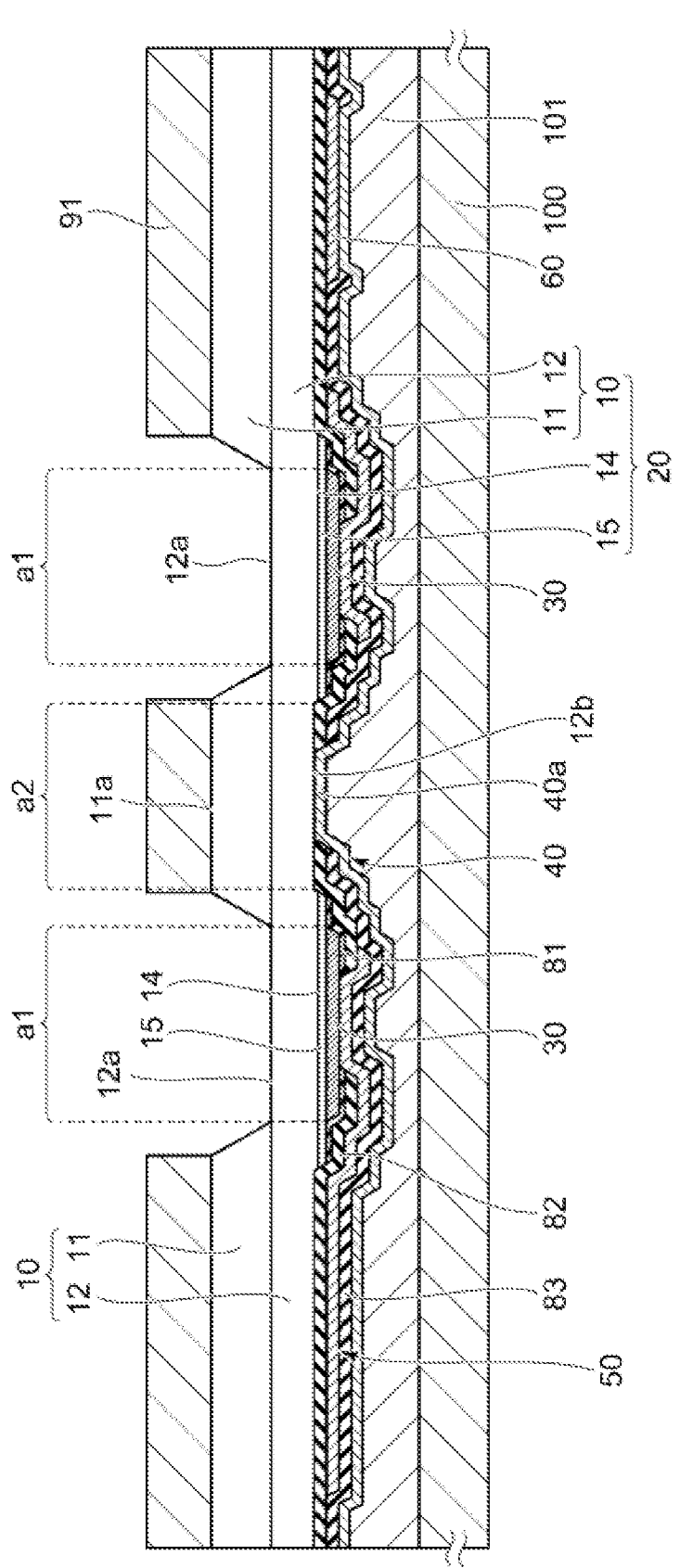
FIG. 8 is a schematic cross-sectional view showing a process in the method of manufacturing a light emitting element according to the first embodiment of the present disclosure.

As shown in FIG. 8, a mask 91 is formed on the surface of the exposed first layer 11, and the first conductivity type semiconductor layer 10 is selectively removed by, for example, RIE. In the first conductivity type semiconductor layer 10, no mask 91 is formed on the first layer 11 in the first region a1 where the active layer 14 and the second conductivity type semiconductor layer 15 are stacked. The first layer 11 in the first region a1 is removed, and the second layer 12 in the first region a1 is exposed from the first layer 11. In this example, the first layer 11 in the first region a1 is entirely removed.

The first layer 11 in the second region a2, which includes the second face 12b to which the n-side conductive part 40a of the first conductive member 40 is connected, is covered by the mask 91 and not removed, allowing the second layer 12 and the first layer 11, which is thicker than the second layer 12 and has a lower Al percentage composition than the second layer 12, to remain.

The mask 91 is also disposed in the area outward from the first region a1 of the first conductivity type semiconductor layer 10, and thus the first layer 11 in the area outward from the first region a1 also remains unremoved.

Figure 9:
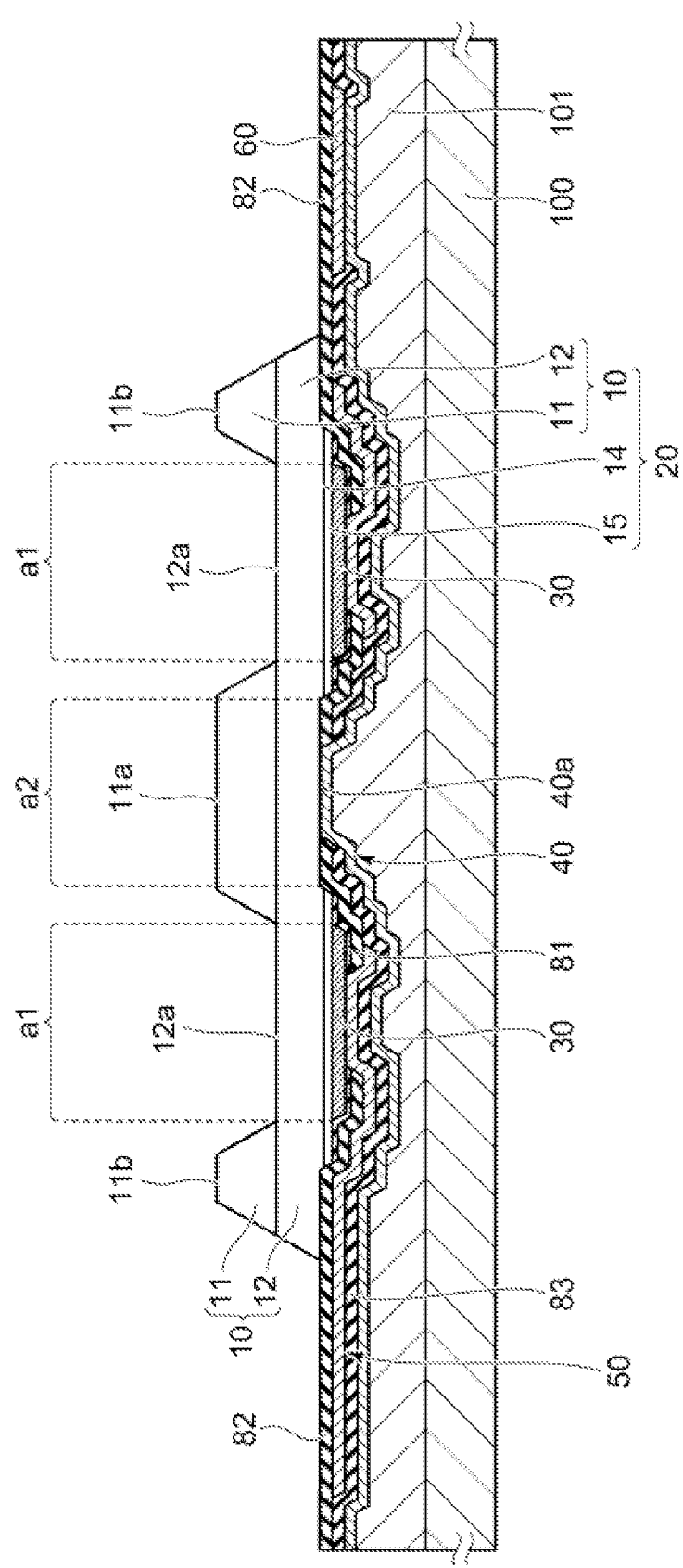
FIG. 9 is a schematic cross-sectional view showing a process in the method of manufacturing a light emitting element according to the first embodiment of the present disclosure.

After selectively removing the first layer 11, the mask 91 is removed. After removing the mask 91, as shown in FIG. 9, the first layer 11 and the second layer 12 in the area outward from the first region a1 are removed. A stack of the first layer 11 and the second layer 12 are maintained in a portion of the area outward from the first region a1 as the peripheral portion of the first conductivity type semiconductor layer 10. In the area outward from the peripheral portion, the second insulating film 82 is exposed from the first layer 11 and the second layer 12.

By following the processes up to this point, as shown in FIG. 9, the surface of the second layer 12 is exposed as the first face 12a in the first region a1, the surface of the first layer 11 is exposed as the third face 11a in the second region a2, and the surface of the first layer 11 is exposed as the fifth face 11b in the peripheral portion. Subsequently, these surfaces are roughened. For example, TMAH (tetramethyl-ammonium hydroxide) is used to roughen the surfaces. The thickness of the first layer 11 after roughening is, for example, preferably 0.3 μm to 3 μm, more preferably 1 μm to 2.5 μm. The thickness of the second layer 12 after roughening is, for example, preferably 0.3 μm to 1.5 μm, more preferably 0.5 μm to 1.2 μm.

Figure 10:
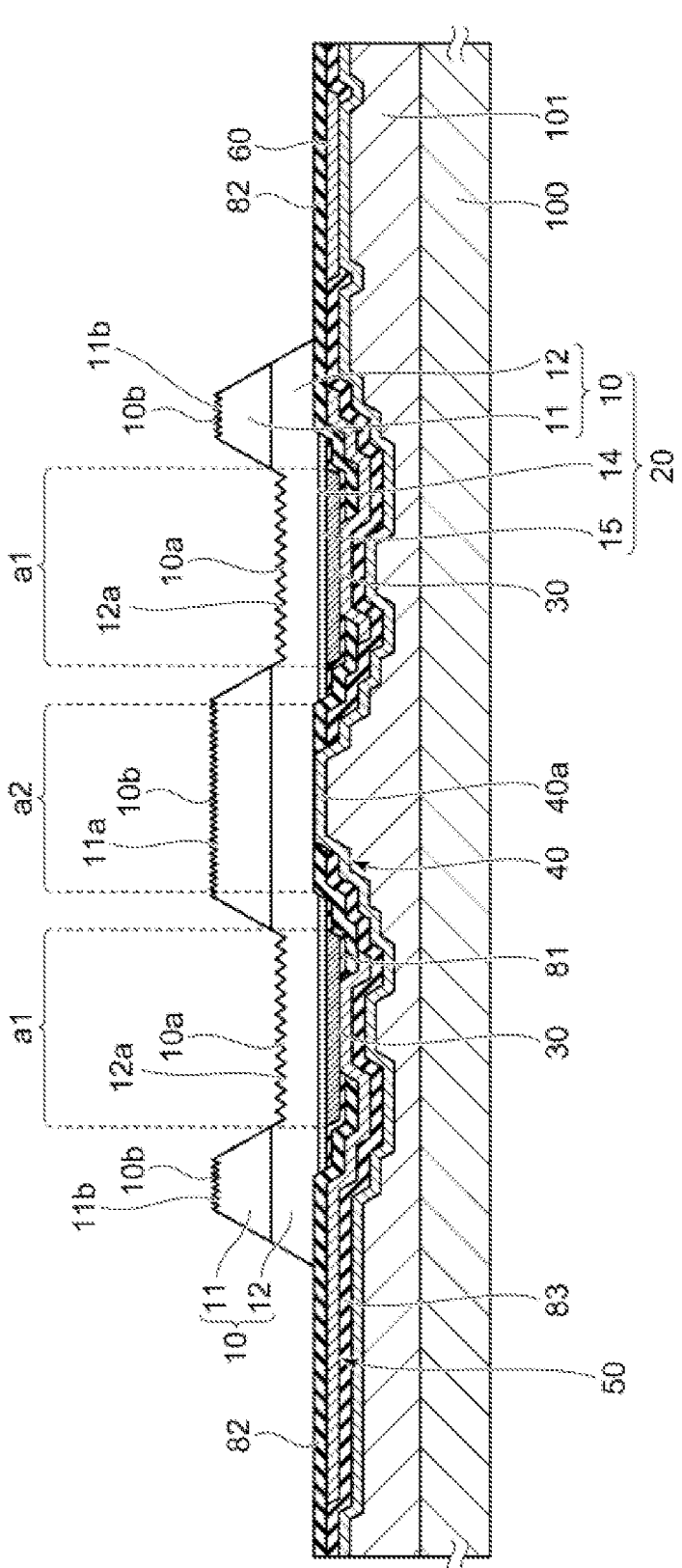
FIG. 10 is a schematic cross-sectional view showing a process in the method of manufacturing a light emitting element according to the first embodiment of the present disclosure.

As shown in FIG. 10, a plurality of first protrusions 10a are formed on the first face 12a of the second layer 12 in the first region a1, and a plurality of second protrusions 10b are formed on the third face 11a of the first layer 11 in the second region a2 and the fifth face 11b of the first layer 11 in the peripheral portion.

In wet etching a nitride semiconductor layer containing Al and Ga using TMAH, the higher the Al percentage composition, the higher the etching rate and the greater the surface roughness tend to be. Because the Al percentage composition of the second layer 12 is higher than the Al percentage composition of the first layer 11, the arithmetic mean height of the first protrusions 10a formed on the first face 12a of the second layer 12 is greater than the arithmetic mean height of the second protrusions 10b formed on the third face 11a and the fifth face 11b of the first layer 11. By creating higher first protrusions 10a on the first face 12a in the first region a1 that has an active layer 14 and a large contribution to the light extraction efficiency, the light extraction efficiency may be increased.

On the other hand, because the Al percentage composition of the first layer 11 is lower than the Al percentage composition of the second layer 12, the etching rate for the first layer 11 in wet etching tends to be lower than the etching rate for the second layer 12. Reducing the etched amount of the third face 11a in the second region a2 can moderate the reduction in the thickness of the first layer 11 in the second region a2. Because the Al percentage composition of the first layer 11 is lower than Al percentage composition of the second layer 12, moderating the reduction in the thickness of the first layer 11 in the second region a2 connected to the n-side conductive part 40a of the first conductive member 40 can, as described earlier, reduce the forward voltage (drive voltage) Vf.

After roughening the surface of the first conductivity type semiconductor layer 10, a fourth insulating film 84 is formed to cover the first conductivity type semiconductor layer 10 and the second insulating film 82. Subsequently, a portion of the second insulating film 82 and a portion of the fourth insulating film 84 that are located in the area outward from the first conductivity type semiconductor layer 10 are removed. This, as shown in FIG. 2, exposes a portion of the second conductive member 50 from the second insulating film 82 as a pad connection part 50b, and a second pad electrode 72 is formed on the pad connection part 50b. Furthermore, a portion of the third conductive member 60 is exposed from the second insulating film 82, and a first pad electrode 71 is formed on the third conductive member 60.

In the process described earlier with reference to FIG. 8, after removing the first layer 11 in the first region a1 using the mask 91 to expose the first face 12a of the second layer 12 in the first region a1 from the first layer 11, the first face 12a of the second layer 12 in the first region a1 can be roughened by etching with, for example, TMAH while maintaining the mask 91 that covers the third face 11a of the first layer 11 in the second region a2.

Figure 11:
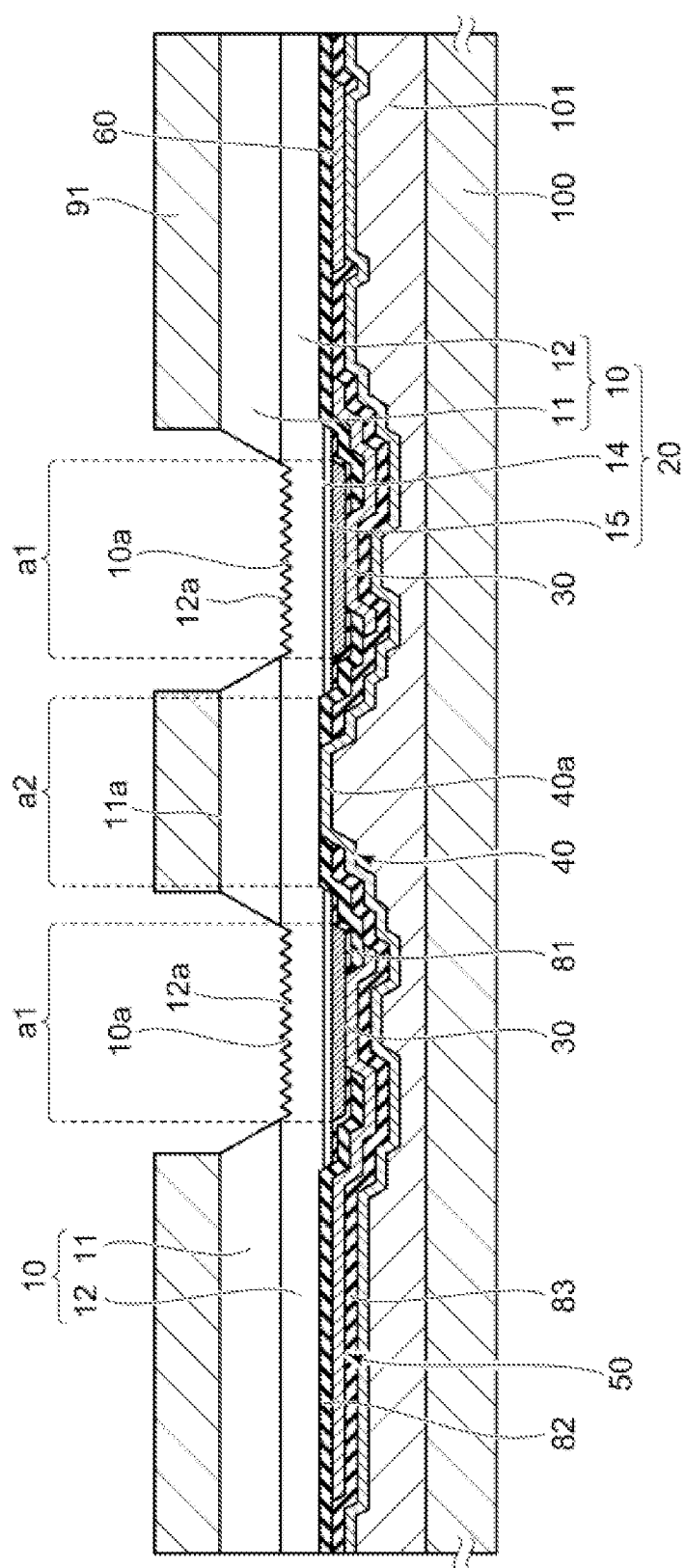
FIG. 11 is a schematic cross-sectional view showing another process in the method of manufacturing a light emitting element of the first embodiment of the present disclosure.
Figure 12:
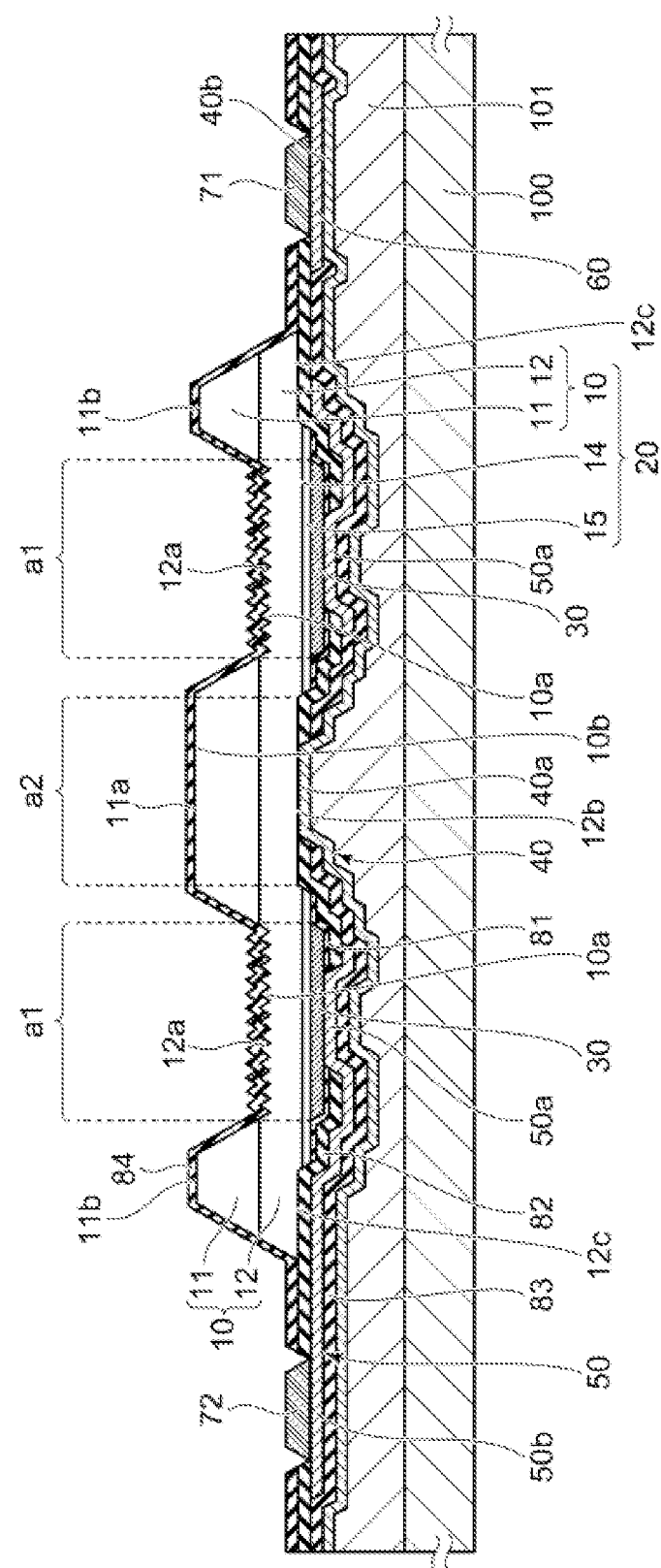
FIG. 12 is a schematic cross-sectional view of a light emitting element obtained after the process shown in FIG. 11.

Roughening while covering the third face 11a of the first layer 11 in the second region a2 with the mask 91 can create a plurality of first protrusions 10a on the first face 12a of the second layer 12 in the first region a1, but does not create protrusions or depressions on the third face 11a of the first layer 11 in the second region a2 covered by the mask 91 as shown in FIG. 11. The mask 91 used in removing the first layer 11 in the first region a1 can be utilized in roughening the first face 12a of the second layer 12 in the first region a1, thereby simplifying the process. Such a roughening process allows the third face 11a of the first layer 11 in the second region a2 to be unetched to remain flat as shown in FIG. 12. This can make the first layer 11 in the second region a2 thicker, thereby reducing the Vf.

Second Embodiment

Figure 13:
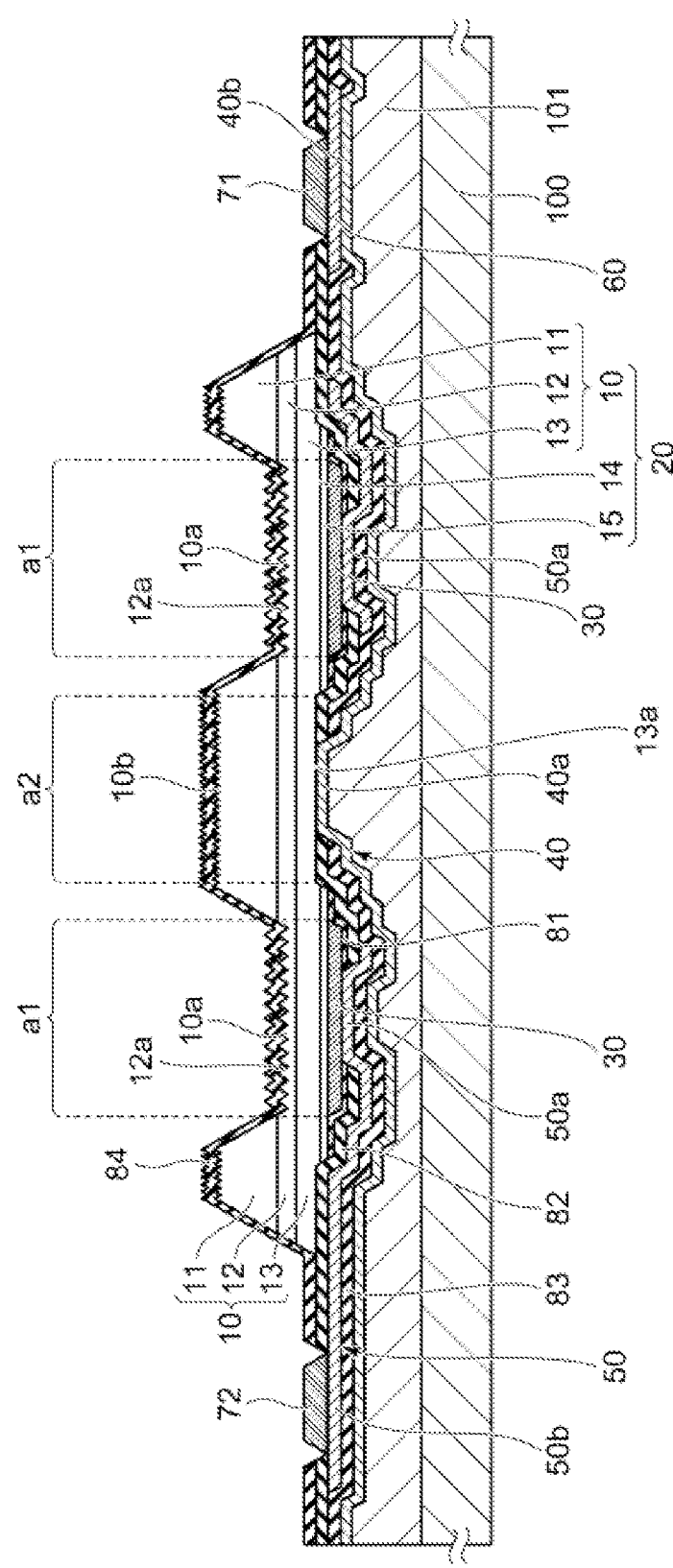
FIG. 13 is a schematic cross-sectional view of a light emitting element according to a second embodiment of the present disclosure.

FIG. 13 is a schematic cross-sectional view of a light emitting element according to a second embodiment of the present disclosure. The light emitting element according to the second embodiment has the same structure as the first embodiment shown in FIG. 2 except for the features described below. Only the differences from the first embodiment will basically be descried below.

In this embodiment, the first conductivity type semiconductor layer 10 has a third layer 13 in addition to the first layer 11 and the second layer 12. The third layer 13 is also a nitride semiconductor layer containing Al and Ga, for example, an AlGaN layer. The Al percentage composition of the second layer 12 is higher than the Al percentage composition of the first layer 11, and the Al percentage composition of the third layer 13 is higher than the Al percentage composition of the second layer 12. The Al percentage composition difference between the first layer 11 and the second layer 12 is preferably in a range of 1% to 4%. The Al percentage composition difference between the second layer 12 and the third layer 13 is preferably more than 0% and up to 4%. For example, the Al percentage composition of the first layer 11 is 3%, the Al percentage composition of the second layer 12 is 4%, and the Al percentage composition of the third layer 13 is 5%. From the standpoint of hindering the first conductivity type semiconductor layer 10 from absorbing light, the Al percentage composition difference between the first layer 11 and the second layer 12 is preferably at least 2%. For example, the Al percentage composition of the first layer 11 is set as 3%, the Al percentage composition of the second layer 12 is set as 5%, and the Al percentage composition of the third layer 13 is set as 6%.

In this embodiment, the first layer 11, the second layer 12, and the third layer 13 are successively formed on the substrate 200, for example, via an underlayer 201. An active layer 14 is formed on the third layer 13, and a second conductivity type semiconductor layer 15 is formed on the active layer 14.

In the first region a1, the second layer 12 having a higher Al percentage composition than the first layer 11 and the third layer 13 having a higher Al percentage composition than the second layer 12 are disposed, but no first layer 11 is disposed. Not disposing a first layer 11 having a lower Al percentage composition and higher light absorption than the second and third layers 12 and 13 in the first region a1 can improve the light extraction efficiency as compared to the case in which a first layer 11 is disposed in the first region a1. By disposing the third layer 13 having a higher Al percentage composition and lower light absorption than the second layer 12 as a layer more closely positioned to the active layer 14 than the second layer 12 can further reduce the light absorption in the first region a1.

Because no first layer 11 is disposed in the first region a1, the thickness of the first conductivity type semiconductor layer 10 in the first region a1 is smaller than the thickness of the first conductivity type semiconductor layer 10 in the second region a2. Reducing the thickness of the first conductivity type semiconductor layer 10 in the first region a1, which has a large impact on the light extraction efficiency, can reduce the light absorption in the first region a1, thereby improving the light extraction efficiency.

The first layer 11, the second layer 12, and the third layer 13 are stacked in the second region a2. Neither an active layer 14 nor second conductivity type semiconductor layer 15 is stacked in the second region a2. The face (sixth face) 13a of the third layer 13 on the support substrate 100 side in the second region a2 is exposed from the second conductivity type semiconductor layer 15 and the active layer 14. The n-side conductive part 40a of the first conductive member 40 is in contact with the sixth face 13a.

Allowing the second region a2 to also have the first layer 11 having a lower Al percentage composition than the second layer 12 and the third layer 13 can reduce the forward voltage (drive voltage) Vf and reduce the current concentration in the second region a2 as compared to the case in which the second region a2 has no first layer 11. Furthermore, making the first conductivity type semiconductor layer 10 in the second region a2 thicker than the first conductivity type semiconductor layer 10 in the first region a1 can reduce the resistance of the second region a2, thereby reducing the Vf.

Third Embodiment

Figure 14:
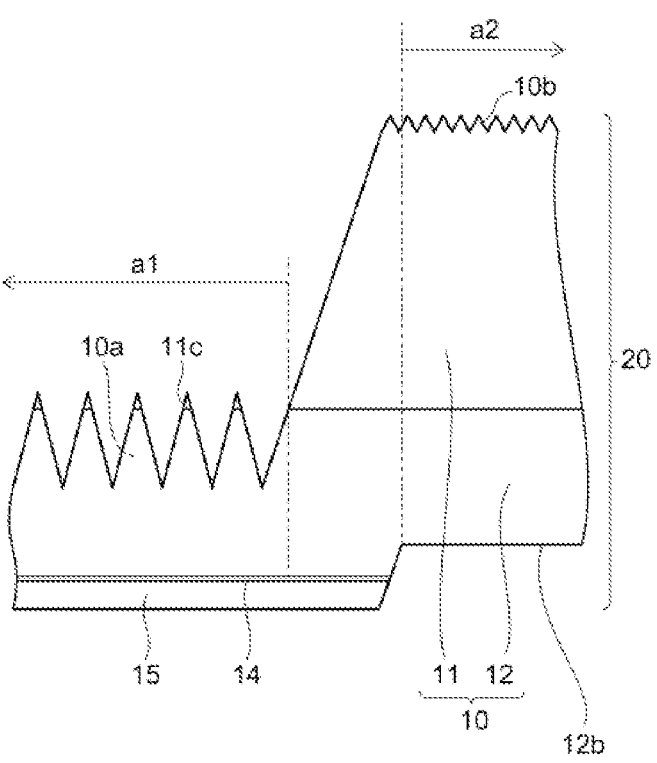
FIG. 14 is a schematic cross-sectional view of a light emitting element according to a third embodiment of the present disclosure.

FIG. 14 is a schematic cross-sectional view of a light emitting element according to a third embodiment of the present disclosure. FIG. 14, similar to FIG. 3 described earlier, is an enlarged schematic cross section of a portion of the semiconductor stack 20.

According to the third embodiment, portions 11c of the first layer 11 are provided in the first region a1. The thickness of a portion 11c of the first layer 11 in the first region a1 is smaller than the thickness of the second layer 12 in the first region a1, and smaller than the thickness of the first layer 11 in the second region a2. The thickness of a portion 11c of the first layer 11 in the first region a1 means the maximum thickness of the portion 11c of the first layer 11 in the first region a1.

In the third embodiment, the first layer 11 in the first region a1 is partially removed, instead of being entirely removed, after exposing the surface of the first layer 11 in the process shown in FIG. 7 discussed earlier. The second region a2 is allowed to maintain the first layer 11 with a greater thickness than the first layer 11 in the first region a1. In the step of partially removing the first layer 11, by not entirely removing the first layer 11 in the first region a1, the first region a1 is allowed to maintain a thinner first layer 11 than that in the second region a2 and the second layer 12. Subsequently, the surfaces of the first region a1 and the second region a2 are roughened by etching with TMAH, for example.

In the example shown in FIG. 14, the portions 11c of the first layer 11 are located at the apexes of the cone or pyramid shaped first protrusions 10a on the surface of the second layer 12 in the first region a1. The thickness of the second portion 11c of the first layer 11 is smaller than the height of the first protrusion 10a on the second layer 12. In the third embodiment, the first protrusion 10a has a trapezoidal shape in a cross-sectional view in FIG. 14, and the height of the first protrusion 10a represents the height of the trapezoid. The portions 11c of the first layer 11 each have a triangular shape in a cross-sectional view in FIG. 14, and the thickness of a portion 11c of the first layer 11 represents the height of the triangle.

The first layer 11 has a lower Al percentage composition and higher light absorption than the second layer 12, but limiting the first layer 11 in the first region a1 to the portions 11c that are thinner than the second layer 12 and thinner than the first layer 11 in the second region a2 can substantially eliminate the impact of the light absorption by the first layer 11 in the first region a1 on the light extraction efficiency.

Next, a method of manufacturing another variation of the light emitting element of the first embodiment will be explained with reference to FIG. 16 to FIG. 18. This variation is also applicable to the second embodiment and the third embodiment.

Figure 16:
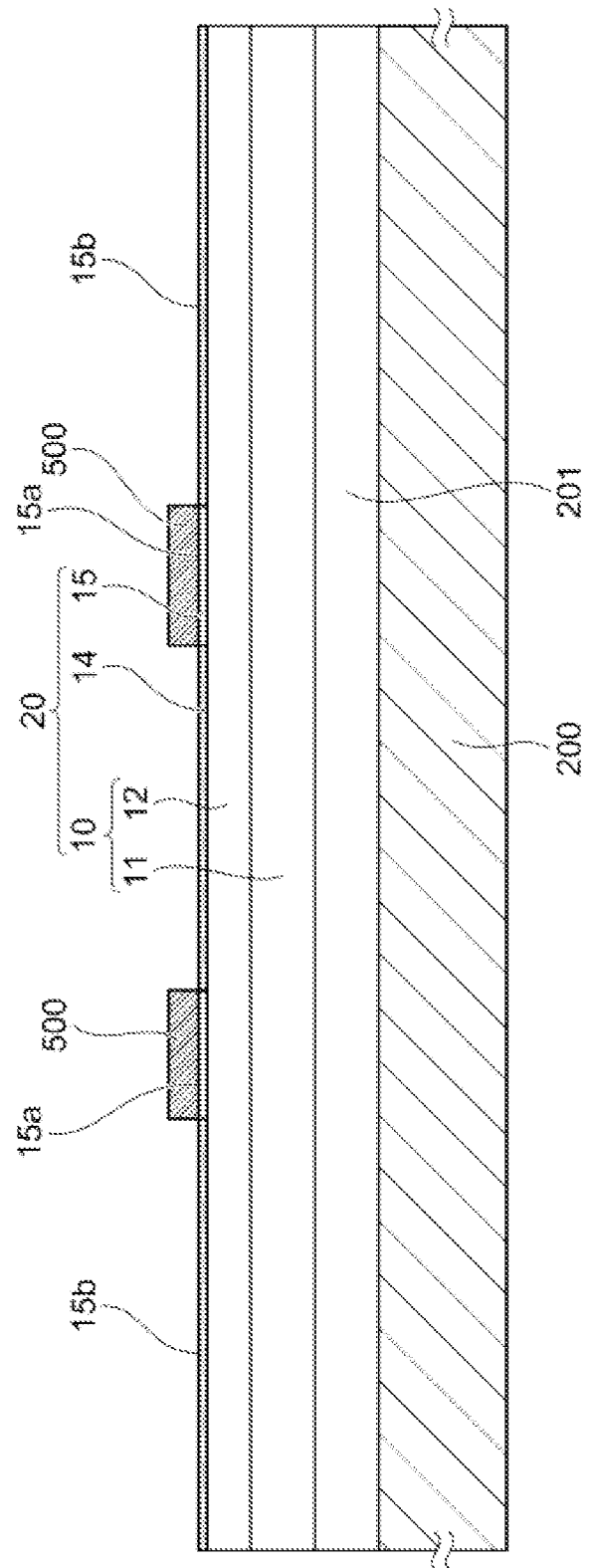
FIG. 16 is a schematic cross-sectional view showing a process in a method of manufacturing another variation of the light emitting element according to the first embodiment.

After forming a semiconductor stack 20 on a substrate 200 as previously described with reference to FIG. 4, a portion of the surface of the second conductivity type semiconductor layer 15 can be modified as shown in FIG. 16. In FIG. 16 and the subsequent drawings, the portions of the surface of the second conductivity type semiconductor layer 15 marked with dot hatching are modified. For example, a mask 500 is formed on a portion of the surface of the second conductivity type semiconductor layer 15, which will be positioned above the first region a1 of the first conductivity type semiconductor layer 10 described earlier. Then the surface of the second conductivity type semiconductor layer 15 exposed from the mask 500 is plasma treated in ambient air containing oxygen, for example.

The modified surface of the second conductivity type semiconductor layer 15 has a higher resistance than the surface of the second conductivity type semiconductor layer 15 that is not modified. In other words, on the surface of the second conductivity type semiconductor layer 15, a low resistance portion (unmodified portion) 15a and a high resistance portion (modified portion) 15b having a higher resistance than that of the low resistance portion 15a are formed.

Figure 17:
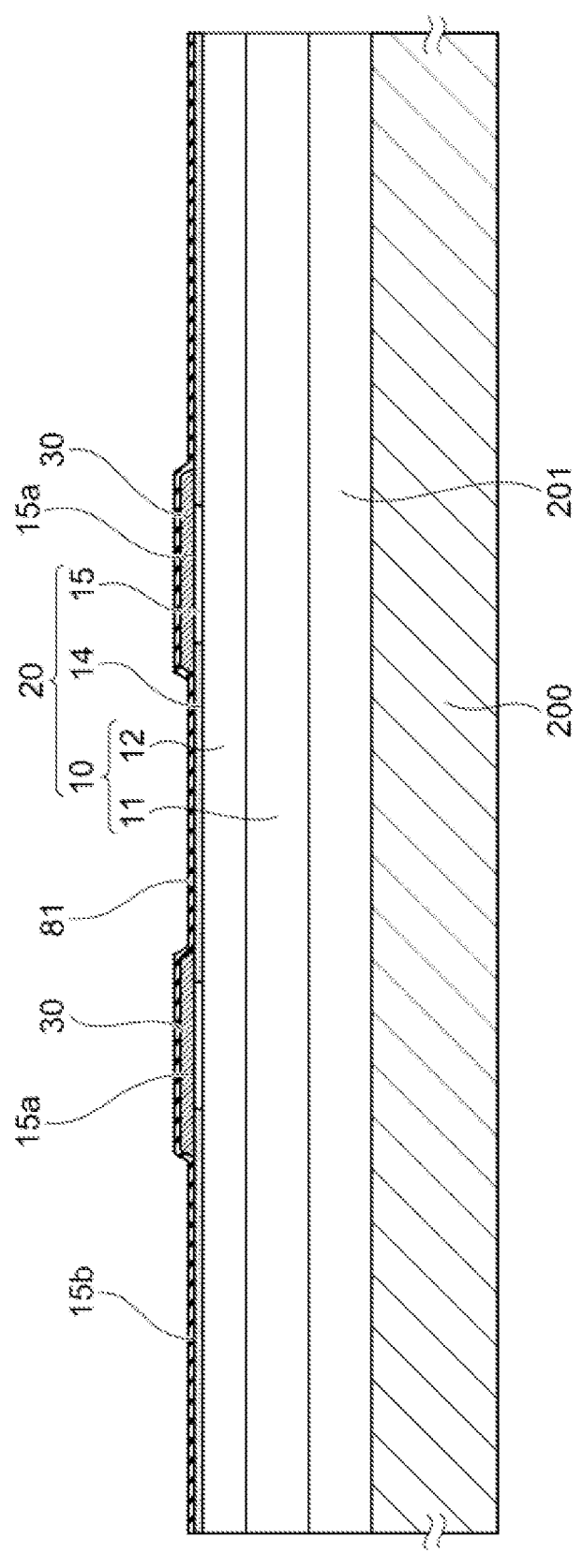
FIG. 17 is a schematic cross-sectional view showing a process in a method of manufacturing another variation of the light emitting element according to the first embodiment.

Subsequently, as shown in FIG. 17, a reflective electrode 30 is formed on the surface of the second conductivity type semiconductor layer 15 so as to straddle the low resistance portion 15a and the high resistance portion 15b. The reflective electrode 30 is in contact with the entire low resistance portion 15a. The reflective electrode 30 is in contact with a portion of the high resistance portion 15b. The area of contact between the reflective electrode 30 and the low resistance portion 15a is larger than the area of contact between the reflective electrode 30 and the high resistance portion 15b. After forming the reflective electrode 30, a first insulating film 81 is formed to cover the surfaces of the reflective electrode 30 and the second conductivity type semiconductor layer 15.

Figure 18:
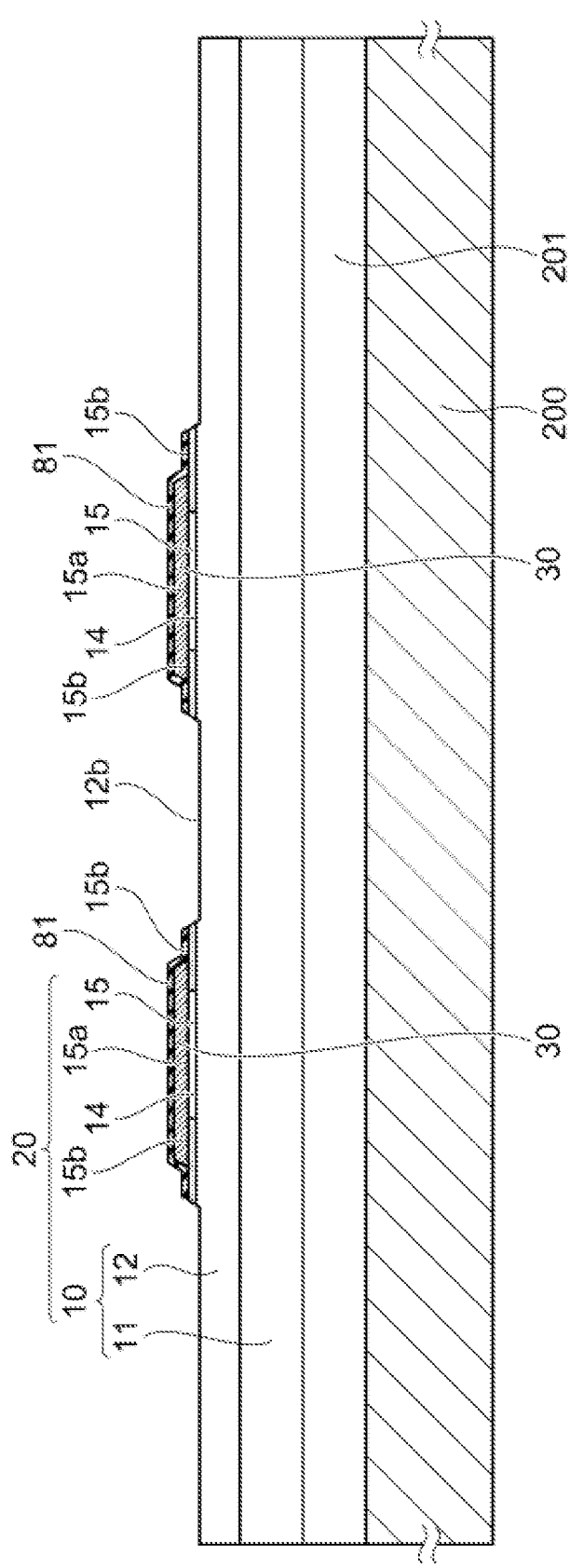
FIG. 18 is a schematic cross-sectional view showing a process in a method of manufacturing another variation of the light emitting element according to the first embodiment.

Subsequently, as shown in FIG. 18, a portion of the first insulating film 81, a portion of the second conductivity type semiconductor layer 15, and a portion of the active layer 14 are removed. This partially exposes the second layer 12 of the first conductivity type semiconductor layer 10 from the second conductivity type semiconductor layer 15 and the active layer 14. The surface of the remaining unremoved second conductivity type semiconductor layer 15 includes the low resistance portion 15a and the high resistance portion 15b.

Subsequently, the processes shown in FIG. 6 and onward described earlier are followed to obtain the light emitting element shown in FIG. 19. The surface of the second conductivity type semiconductor layer 15 stacked in the first region a1 of the first conductivity type semiconductor layer 10 includes the low resistance portion 15a and the high resistance portion 15b. The high resistance portion 15b includes a high resistance portion 15bc positioned closer to the second region a2 than the low resistance portion 15a. The high resistance portion 15b also includes a high resistance portion 15b positioned near the periphery of the first conductivity type semiconductor layer 10. The current density of the high resistance portion 15b is lower than the current density of the low resistance portion 15a. Accordingly, the active layer 14 in the area where the low resistance portion 15a is disposed tends to emit light more intensely than the active layer 14 in the area where the high resistance portion 15b is disposed.

By positioning the high resistance portion 15b in the second region 11a where the first layer 11 having higher light absorption than the second layer 12 of the first conductivity type semiconductor layer 10 is disposed and in the peripheral area thereof, the emission in the area near the first layer 11 can be reduced to thereby reduce the light absorption by the first layer 11. Because the reflective electrode 30 is also in contact with the high resistance portion 15b, the light absorption by the first layer 11 may be reduced and the light extraction efficiency may be improved while maintaining the area of the reflective electrode 30.

Figure 19:
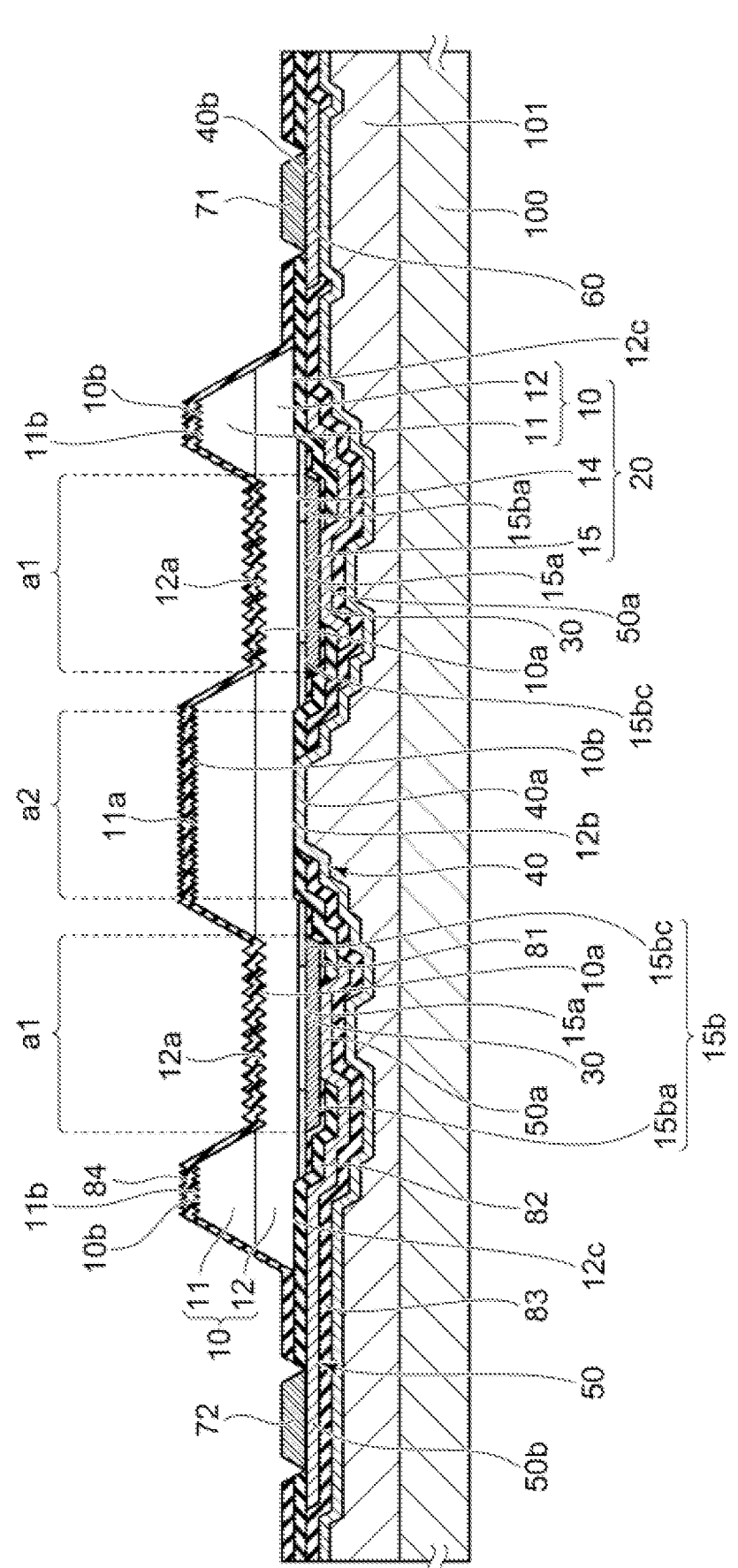
FIG. 19 is a schematic cross-sectional view of another variation of the light emitting element according to the first embodiment.

In the cross section in FIG. 19, the width of a portion of the reflective electrode 30 where the high resistance portion 15b is in contact is preferably 3 μm to 25 μm, for example, more preferably 5 μm to 20 μm.

In the cross section in FIG. 19, the width of the high resistance portion 15ba of the high resistance portion 15b positioned closer to the periphery of the first conductivity type semiconductor layer 10 is preferably larger than the width of the high resistance portion 15bc positioned closer to the second region a2. Making the width of the high resistance portion 15ba near the peripheral portion in which the first layer 11 is disposed more broadly than the second region a2 larger than that of the high resistance portion 15bc can improve the effect of reducing the light absorption by the first layer 11.

In the foregoing, certain embodiments of the present invention have been explained with reference to specific examples. The present invention, however, is not limited to these specific examples. Any form implementable by a person of ordinary skill in the art by suitably changing the design based on any of the embodiments descried above will fall within the scope of the present invention so long as it encompasses the subject matter of the present invention. In addition, various changes and modifications a person of ordinary skill in the art would be able to make under the ideas of the present invention would also fall within the scope of the present invention.

What is claimed is:

1. A light emitting element comprising:
   a semiconductor stack comprising:
     a first conductivity type semiconductor layer,
     a second conductivity type semiconductor layer, and
     an active layer disposed between the first conductivity type semiconductor layer and the second conductivity type semiconductor layer;
   a first conductive member electrically connected to the first conductivity type semiconductor layer; and
   a second conductive member electrically connected to the second conductivity type semiconductor layer;
     wherein:
   the first conductivity type semiconductor layer is a nitride semiconductor layer containing Al and Ga, the first conductivity type semiconductor layer comprises a first layer and a second layer, and an Al percentage composition of the first layer is lower than an Al percentage composition of the second layer;
   the first conductivity type semiconductor layer comprises:
     a first region under which the second conductivity type semiconductor layer and the active layer are stacked; and
     a second region in which a lower surface of the first conductivity type semiconductor layer is exposed from the second conductivity type semiconductor layer and the active layer, wherein, in the second region, a lower surface of the second layer directly contacts an upper surface of the first conductive member;
   a thickness of the first layer in the first region is smaller than a thickness of the first layer in the second region; and
   a plurality of first protrusions are formed on an upper surface of the second layer in the first region, and a plurality of second protrusions are formed on an upper surface of the first layer in the second region, wherein an arithmetic mean height of the first protrusions is greater than an arithmetic mean height of the second protrusions.

2. The light emitting element according to claim 1, wherein:

a thickness of the second layer in the second region is smaller than the thickness of the first layer in the second region.

3. The light emitting element according to claim 1, wherein:

a thickness of the second layer in the second region is no more than 80% of the thickness of the first layer in the second region.

4. The light emitting element according to claim 1, wherein:

a peak wavelength of light from the active layer is no more than 400 nm.

5. The light emitting element according to claim 1, wherein:

the second conductive member and the second conductivity type semiconductor layer are located below the first region of the first conductivity type semiconductor layer.

6. A light emitting element comprising:

a semiconductor stack comprising:

a first conductivity type semiconductor layer, a second conductivity type semiconductor layer, and an active layer disposed between the first conductivity type semiconductor layer and the second conductivity type semiconductor layer;

a first conductive member electrically connected to the first conductivity type semiconductor layer; and a second conductive member electrically connected to the second conductivity type semiconductor layer; wherein:

the first conductivity type semiconductor layer is a nitride semiconductor layer containing Al and Ga, the first conductivity type semiconductor layer comprises a first layer and a second layer, and an Al percentage composition of the first layer is lower than an Al percentage composition of the second layer;

the first conductivity type semiconductor layer comprises:

a first region under which the second conductivity type semiconductor layer and the active layer are stacked, wherein, in the first region, an upper surface of the second layer is exposed from the first layer, and a second region in which the lower surface of the first conductivity type semiconductor layer is exposed from the second conductivity type semiconductor layer and the active layer, the second region being connected to the first conductive member; and a plurality of first protrusions are formed on an upper surface of the second layer in the first region, and a plurality of second protrusions are formed on an upper surface of the first layer in the second region, wherein an arithmetic mean height of the first protrusions is greater than an arithmetic mean height of the second protrusions.

* * * * *